United States Patent
Choi et al.

(10) Patent No.: US 9,728,490 B2
(45) Date of Patent: Aug. 8, 2017

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Ju-Il Choi, Seongnam-si (KR); Hyo-Ju Kim, Seoul (KR); Yeun-Sang Park, Yongin-si (KR); Atsushi Fujisaki, Seongnam-si (KR); Kwang-Jin Moon, Hwaseong-si (KR); Byung-Lyul Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/151,079

(22) Filed: May 10, 2016

(65) Prior Publication Data
US 2017/0062308 A1    Mar. 2, 2017

(30) Foreign Application Priority Data
Aug. 24, 2015 (KR) .................. 10-2015-0119066

(51) Int. Cl.
*H01L 23/485* (2006.01)
*H01L 23/48* (2006.01)
(Continued)

(52) U.S. Cl.
CPC .......... *H01L 23/481* (2013.01); *H01L 23/291* (2013.01); *H01L 23/3171* (2013.01); *H01L 23/3192* (2013.01); *H01L 23/528* (2013.01); *H01L 23/5226* (2013.01); *H01L 23/5329* (2013.01); *H01L 24/06* (2013.01); *H01L 24/17* (2013.01); *H01L 21/486* (2013.01); *H01L 21/76807* (2013.01); *H01L 23/49827* (2013.01); *H01L 23/53223* (2013.01); *H01L 23/53238* (2013.01); *H01L 23/53266* (2013.01); *H01L 23/53271* (2013.01); *H01L 2224/0401* (2013.01); *H01L 2224/05025* (2013.01); *H01L 2224/05082* (2013.01);
(Continued)

(58) Field of Classification Search
CPC  H01L 21/486; H01L 23/481; H01L 23/49827
USPC ........................................ 257/698
See application file for complete search history.

(56) References Cited

U.S. PATENT DOCUMENTS 7,605,080 B2    10/2009 Koizumi et al.
8,202,800 B2    6/2012 Chen et al.
(Continued)

Primary Examiner — George Fourson, III
(74) Attorney, Agent, or Firm — Ward and Smith, P.A.

(57) ABSTRACT

A semiconductor device includes a via structure penetrating through a substrate, a portion of the via structure being exposed over a surface of the substrate, a protection layer pattern structure provided on the surface of the substrate and including a first protection layer pattern and a second protection layer pattern, the first protection layer pattern surrounding a lower sidewall of the exposed portion of the via structure and exposing an upper sidewall of the exposed portion of the via structure, the second protection layer pattern exposing a portion of the top surface of the first protection layer pattern adjacent to the sidewall of the via structure, and a pad structure provided on the via structure and the protection layer pattern structure and covering the top surface of the first protection layer pattern exposed by the second protection layer pattern.

16 Claims, 25 Drawing Sheets

(51) Int. Cl.
   *H01L 23/31* (2006.01)
   *H01L 23/532* (2006.01)
   *H01L 23/29* (2006.01)
   *H01L 23/528* (2006.01)
   *H01L 23/522* (2006.01)
   *H01L 23/00* (2006.01)
   *H01L 21/768* (2006.01)
   *H01L 23/498* (2006.01)
   *H01L 21/48* (2006.01)

(52) U.S. Cl.
   CPC .............. *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/13139* (2013.01); *H01L 2224/13147* (2013.01); *H01L 2224/16227* (2013.01); *H01L 2924/01013* (2013.01); *H01L 2924/01029* (2013.01); *H01L 2924/01074* (2013.01); *H01L 2924/0496* (2013.01); *H01L 2924/04941* (2013.01); *H01L 2924/04953* (2013.01); *H01L 2924/0501* (2013.01); *H01L 2924/05032* (2013.01); *H01L 2924/05042* (2013.01); *H01L 2924/05442* (2013.01); *H01L 2924/10252* (2013.01); *H01L 2924/10253* (2013.01); *H01L 2924/10271* (2013.01); *H01L 2924/10328* (2013.01); *H01L 2924/10329* (2013.01); *H01L 2924/10331* (2013.01); *H01L 2924/13091* (2013.01); *H01L 2924/1431* (2013.01); *H01L 2924/1434* (2013.01)

(56) References Cited

U.S. PATENT DOCUMENTS

| | | | |
|---|---|---|---|
| 8,513,119 B2 | 8/2013 | Chang et al. | |
| 8,735,251 B2 | 5/2014 | Andry et al. | |
| 8,791,549 B2 | 7/2014 | Chen et al. | |
| 8,853,830 B2 | 10/2014 | Chang et al. | |
| 8,859,425 B2 | 10/2014 | Kirby et al. | |
| 2013/0200525 A1* | 8/2013 | Lee | H01L 23/481 257/774 |
| 2015/0024546 A1 | 1/2015 | Chang et al. | |
| 2015/0137325 A1* | 5/2015 | Hong | H01L 23/528 257/621 |
| 2015/0333014 A1* | 11/2015 | Wirz | H01L 21/0274 257/774 |
| 2016/0155686 A1* | 6/2016 | Lee | H01L 23/481 257/737 |

\* cited by examiner

_US 9,728,490 B2_

SEMICONDUCTOR DEVICES AND METHODS OF MANUFACTURING THE SAME

PRIORITY STATEMENT

This application claims priority under 35 U.S.C. §119 to Korean Patent Application No. 10-2015-0119066, filed on Aug. 24, 2015 in the Korean Intellectual Property Office (KIPO), the disclosure of which is herein incorporated by reference in its entirety.

BACKGROUND

1. Field

Example embodiments described herein relate to semiconductor devices and methods of manufacturing the same. More particularly, example embodiments described herein relate to semiconductor devices having via structures and methods of manufacturing the same.

2. Description of the Related Art

To facilitate the increased integration of semiconductor devices, three-dimensional packaging technology, in which a plurality of chips are stacked on each other, has been developed. Through silicon via (TSV) technology is a packaging technology in which a via hole is formed through a silicon substrate, and a via electrode is formed in the via hole.

In order to electrically connect a chip having a TSV therein to another chip, a conductive bump may be formed to contact the TSV. To accomplish this, after a back side of a silicon substrate in which the TSV is formed has been partially removed to expose the TSV, a pad structure may be formed on the TSV, and the conductive pad may be disposed on the pad structure. However, when an etching process is performed to form the pad structure, a seed pattern at a lower portion of the pad structure may be over etched, which can expose a portion of a top surface of a protection layer covering a sidewall of the TSV. Thus, external moisture may permeate into the protection layer through the exposed top surface thereof, which can hurt the reliability of the semiconductor device and a semiconductor package including the semiconductor device.

SUMMARY

Example embodiments provide a semiconductor device having a high reliability and excellent operating performance.

Example embodiments provide a method of manufacturing the semiconductor device.

Example embodiments provide a semiconductor package having a high reliability.

According to example embodiments, a semiconductor device includes a via structure penetrating through a substrate, a portion of the via structure being exposed over a surface of the substrate, a protection layer pattern structure provided on the surface of the substrate and including a first protection layer pattern and a second protection layer pattern, the first protection layer pattern surrounding a lower sidewall of the exposed portion of the via structure and exposing an upper sidewall of the exposed portion of the via structure, the second protection layer pattern exposing a portion of the top surface of the first protection layer pattern adjacent to the sidewall of the via structure, and a pad structure provided on the via structure and the protection layer pattern structure and covering the top surface of the first protection layer pattern exposed by the second protection layer pattern.

In example embodiments, the via structure may include a via electrode including a conductive pattern and a barrier pattern surrounding a sidewall of the conductive pattern, and an insulation layer pattern surrounding the via electrode.

In example embodiments, a top surface of the insulation layer pattern may be lower than a top surface of the via electrode.

In example embodiments, the conductive pattern may include a metal, the barrier pattern comprises a metal nitride and the insulation layer pattern comprises silicon nitride.

In example embodiments, the first protection layer pattern may have an etch selectivity different from that of the second protection layer pattern.

In example embodiments, the first protection layer pattern may include silicon oxide and the second protection layer pattern may include silicon nitride.

In example embodiments, the top surface of the first protection layer pattern exposed by the second protection layer pattern may be lower than a top surface of the via structure.

In example embodiments, the top surface of the first protection layer pattern exposed by the second protection layer pattern may be higher than a bottom surface of the second protection layer pattern.

In example embodiments, the pad structure may include a seed pattern covering a top surface and the upper sidewall of the via structure, the top surface of the first protection layer pattern exposed by the second protection layer pattern and a sidewall of the second protection layer pattern, and a pad provided on the seed pattern.

In example embodiments, a bottom surface of the seed pattern may have an uneven structure corresponding to height variations of the via structure and the protection layer pattern structure.

In example embodiments, the seed pattern may have a flat top surface.

In example embodiments, a width of the seed pattern may be less than a width of the pad.

In example embodiments, the pad may include copper.

In example embodiments, the pad may include a lower pad and an upper pad sequentially stacked on each other.

In example embodiments, the lower pad may include nickel, and the upper pad may include gold.

According to example embodiments, there is provided a method manufacturing a semiconductor device. In the method, a preliminary via structure is formed to partially penetrate through a substrate. The substrate is partially removed to expose a portion of the preliminary via structure. A first protection layer and a second protection layer are sequentially formed on the substrate to form a protection layer structure, the first protection layer covering the exposed via structure and a second protection layer formed on the first protection layer. The protection layer structure and the preliminary via structure are partially etched to form a via structure and a protection layer pattern structure, the protection layer pattern structure including a first protection layer pattern surrounding the exposed portion of the via structure and a second protection layer pattern exposing a portion of a top surface of the first protection layer pattern adjacent to a sidewall of the via structure. The exposed portion of the top surface of the protection layer pattern is partially removed until the top surface of the protection layer pattern is lower than a top surface of the via structure, to form a recess that is defined by the sidewall of the via structure, the top surface of the first protection layer pattern and a sidewall of the second protection layer pattern. A seed pattern is formed on the via structure to fill at least a portion of the recess. A conductive pad is formed on the seed pattern to form a pad structure including the seed pattern and the conductive pad on the seed pattern.

In example embodiments, when the seed pattern is formed, a seed layer may be formed fill at least the portion of the recess, and the seed layer may be partially etched to form the seed pattern covering the top surface of the via structure and the top surface of the first protection layer pattern exposed by the second protection layer pattern.

In example embodiments, when the seed layer is formed, the seed layer may be formed conformally on a bottom surface and a sidewall of the recess such that a top surface of the seed pattern has an uneven structure corresponding to the top surface of the protection layer pattern.

In example embodiments, when the seed layer is formed, the seed layer may be formed to sufficiently fill the recess such that the seed pattern has a flat top surface.

In example embodiments, when the conductive pad is formed, a lower pad including nickel may be formed on the seed layer and an upper pad including gold may be formed on the lower pad.

A semiconductor device according to further embodiments includes a substrate and a conductive plug in the substrate, wherein a portion of the conductive plug protrudes from a surface of the substrate. The structure further includes a first protection layer pattern on the surface of the substrate, wherein the first protection layer pattern contacts a lower portion of an exposed sidewall of the conductive plug that extends past the surface of the substrate, a second protection layer pattern on the first protection layer pattern opposite the substrate, wherein a sidewall of the second protection layer pattern is spaced apart from the conductive plug and exposes an upper portion of the exposed sidewall of the conductive plug, and wherein the first protection layer and the second protection layer define a recess adjacent the upper portion of the exposed sidewall of the conductive plug, and a pad structure on the conductive plug, the first protection layer pattern and the second protection layer pattern, wherein the pad structure extends into the recess.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with some example embodiments.

FIG. 2 is an enlarged view illustrating the A portion in FIG. 1.

FIGS. 3 to 9 are cross-sectional views illustrating semiconductor devices in accordance with other example embodiments.

FIGS. 10 to 22 are cross-sectional views illustrating a method of manufacturing a semiconductor device in accordance with example embodiments.

FIG. 23 is a cross-sectional view illustrating a method of manufacturing a semiconductor device in accordance with other example embodiments.

FIG. 24 is a cross-sectional view illustrating a method of manufacturing a semiconductor device in accordance with other example embodiments.

FIG. 25 is a cross-sectional view illustrating a semiconductor package in accordance with example embodiments.

DETAILED DESCRIPTION OF EMBODIMENTS

Figure 1:
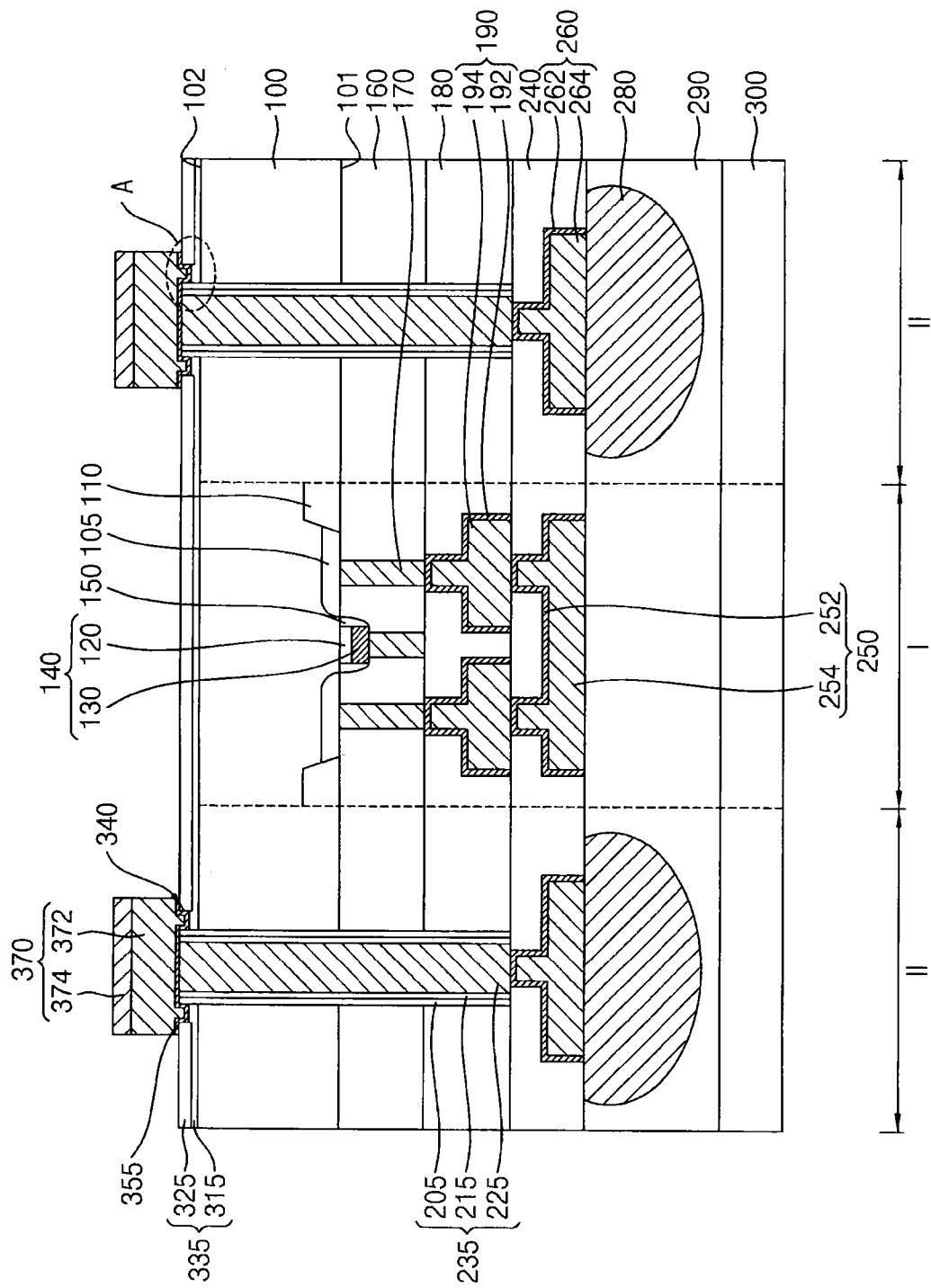
FIGS. 1 to 25 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, example embodiments will be described in detail with reference to the accompanying drawings.

Figure 2:
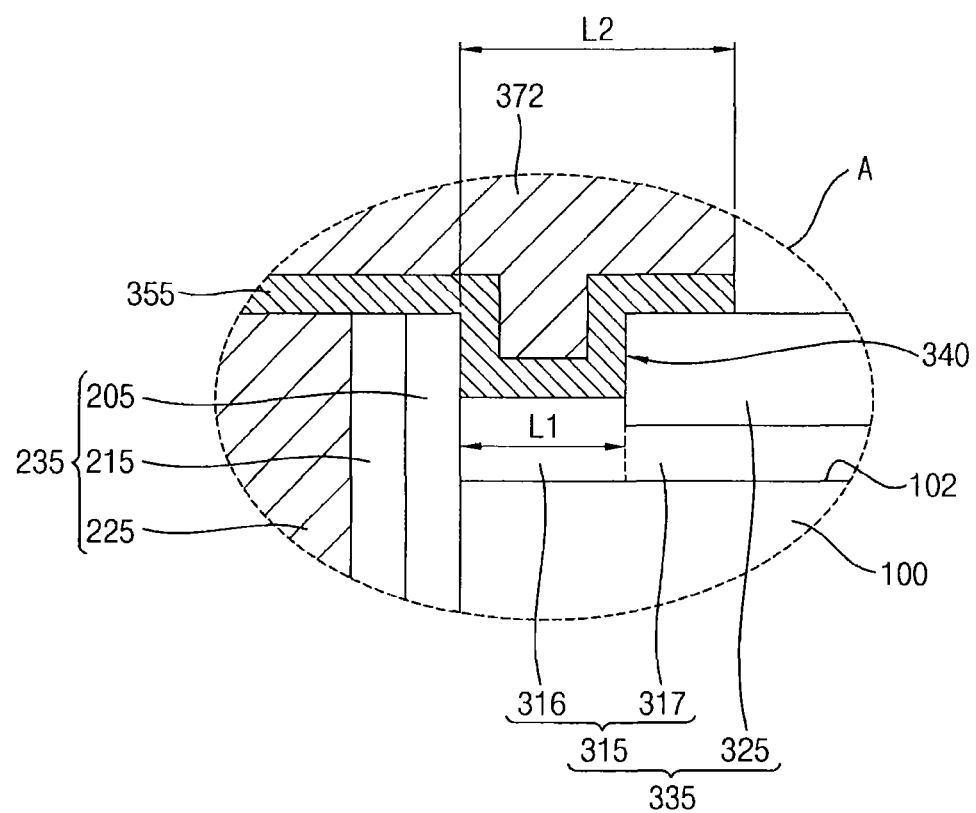

FIG. 1 is a cross-sectional view illustrating a semiconductor device in accordance with some example embodiments. FIG. 2 is an enlarged view illustrating the "A" portion highlighted in FIG. 1.

Referring to FIGS. 1 and 2, a semiconductor device includes a via structure 235 that passes through a substrate 100, a protection layer pattern structure 335, a pad structure 370, first, second and third insulating interlayers 160, 180 and 240, circuit elements 140, first, second and third wirings 190, 250 and 260, a contact plug 170, and a first conductive bump 280. The via structure 235 may in some embodiments be considered a conductive plug that is at least partially buried in the substrate. In some embodiments, the via structure 235 extends completely through the substrate 100 to provide a conductive path from a first surface 101 of the substrate to a second surface 102 that is opposite the first surface 101. However, the inventive concepts are not limited to conductive via structures that extend completely through a substrate.

The substrate 100 may include silicon, germanium, silicon-germanium, or III-V compounds, e.g., GaP, GaAs, GaSb, etc. In some embodiments, the substrate 100 may be a silicon-on-insulator (SOI) substrate, or a germanium-on-insulator (GOI) substrate.

The substrate 100 may have a first surface 101 and a second surface 102 opposite thereto. The substrate 100 may include a first region I and a second region II. In general, circuit elements and wiring patterns are formed in the first region I, while through silicon via (TSV) structures are formed in the second region II. Hereinafter, not only the first and second regions I and II of the substrate 100 but also spaces extended from the first and second regions I and II of the substrate 100 upwardly or downwardly may be defined altogether as the first and second regions I and II, respectively. That is, the first and second regions refer to the corresponding portions of the substrate 100 as well as the corresponding portions of insulating layers and other structures provided on the substrate 100. In example embodiments, the first region I may be a circuit region in which the circuit elements may be formed, and the second region II may be a via region in which the via structure 235 may be formed. In FIG. 1, one first region I and two second regions II are shown, however, a plurality of second regions II and a plurality of first regions I may be formed in the semiconductor device. That is, the semiconductor device may include a plurality of via structures 235, and any region in which a via structure 235 is formed may be defined as a second region II.

The first region I may include a cell region (not shown) in which memory cells may be formed, a peripheral circuit region (not shown) in which peripheral circuits for driving the memory cells may be formed, and/or a logic region in which logic devices may be formed.

An isolation layer 110 including an insulating material, e.g., silicon oxide may be formed at a portion of the substrate 100 adjacent to the first surface 101, and circuit elements, such as transistors, may be formed on the first surface 101 of the substrate 100.

For example, a transistor in the first region I may include a gate structure 140 having a gate insulation layer pattern 120 and a gate electrode 130 sequentially stacked on the first surface 101 of the substrate 100, and an impurity region 105 at a portion of the substrate 100 adjacent to the gate structure 140. A gate spacer 150 may be formed on a sidewall of the gate structure 140.

The gate insulation layer pattern 120 may include an oxide, e.g., silicon oxide or a metal oxide, the gate electrode 130 may include, e.g., doped polysilicon, a metal, a metal nitride and/or a metal silicide, and the gate spacer 150 may include a nitride, e.g., silicon nitride.

In example embodiments, a plurality of transistors may be formed on the first surface 101 of the substrate 100 in the first region I. The circuit elements in the first region I may not be limited to transistors, but may include various types of circuit elements, such as diodes, resistors, inductors, capacitors, etc.

The first, second and third insulating interlayers 160, 180 and 240 may be formed sequentially on the first surface 101 of the substrate 100.

The first insulating interlayer 160 may cover the circuit elements, and the contact plug 170 that contacts the impurity region 105 may be formed through the first insulating interlayer 160. Alternatively, the contact plug 170 may be formed through the first insulating interlayer 160 to contact the gate structure 140. The first insulating interlayer 160 may include an oxide, e.g., silicon oxide, and the contact plug 170 may include an electrically conductive material, such as a metal, a metal nitride, a metal silicide, doped polysilicon, etc.

The second insulating interlayer 180 is formed on the first insulating interlayer 160. The first wiring 190 is formed in the second insulating interlayer 180 and contacts the first contact plug 170. The second insulating interlayer 180 may include a low-k dielectric material, such as silicon oxide doped with fluorine or carbon, a porous silicon oxide, spin on organic polymer, or an inorganic polymer, such as hydrogen silsesquioxane (HSSQ), methyl silsesquioxane (MSSQ), etc.

In some embodiments, the first wiring 190 may include a first conductive pattern 194 and a first barrier pattern 192 that partially covers the first conductive pattern 194. The first conductive pattern 194 may include a metal, such as copper, aluminum, tungsten, titanium, tantalum, etc., and the first barrier pattern 192 may include a metal nitride, such as titanium nitride, tantalum nitride, tungsten nitride, copper nitride, aluminum nitride, etc.

In some embodiments, the first wring 190 may be formed by a double damascene process such that upper and lower portions of the first wiring 190 may have different widths from each other. Alternatively, the first wiring 190 may be formed by a single damascene process such that the first wiring 190 may have a substantially constant width. In FIG. 1, the illustrated first wiring 190 is formed by the double damascene process.

The via structure 235 may extend through the first and second insulating interlayers 160 and 180 and the substrate 100, and a portion of the via structure 235 may extend past the second surface 102 of the substrate 100.

In some embodiments, the via structure 235 may include a via electrode and an insulation layer pattern 205 surrounding a sidewall of the via electrode. The via electrode may include a second conductive pattern 225 and a second barrier pattern 215 surrounding a sidewall of the second conductive pattern 225. The second conductive pattern 225 may include a metal, such as copper, aluminum, tungsten, etc., or doped polysilicon, and the second barrier pattern 215 may include a metal nitride, such as titanium nitride, tantalum nitride, tungsten nitride, copper nitride, aluminum nitride, etc. The insulation layer pattern 205 may include an oxide, such as silicon oxide, or a nitride, such as silicon nitride.

In some embodiments, end surfaces of the second conductive pattern 225, the second barrier pattern 215 and the insulation layer pattern 205 may be substantially coplanar with one another.

In some embodiments, the protection layer pattern structure 335 may include a first protection layer pattern 315 and a second protection layer pattern 325 that are sequentially stacked on the second surface 102 of the substrate 100. The first and second protection layer patterns 315 and 325 may include an oxide, such as silicon oxide, a nitride, such as silicon nitride, a silicon oxynitride, etc.

In some embodiments, the first protection layer pattern 315 may have an etch selectivity that is different from that of the second protection layer pattern 325. For example, when the first protection layer pattern 315 includes silicon oxide, the second protection layer pattern 325 may include silicon nitride. Alternatively, when the first protection layer 315 includes silicon nitride, the second protection layer patter 325 may include silicon oxide.

The first protection layer pattern 315 may be formed on the second surface 102 of the substrate 100. As can be seen in FIG. 2, the first protection layer pattern 315 may surround a sidewall of the via structure 235 that is exposed above the second surface 102 of the substrate, and may expose an upper sidewall of the portion of the via structure 235 that extends above the surface 102 of the substrate 100.

As illustrated in FIG. 2, the first protection layer pattern 315 may include a surrounding portion 316 that surrounds the exposed via structure 235 and a protecting portion 317 around the surrounding portion 316 on the second surface 102 of the substrate 100. In this case, a top surface of the surrounding portion 316 may be higher than a top surface of the protecting portion 317. That is the surrounding portion 316 of the first protection layer pattern 315 may be thicker than the protecting portion 317 of the first protection layer pattern 315. In some embodiments, the top surface of the surrounding portion 316 may be coplanar with or lower than the top surface of the protecting portion 317.

The top surface of the surrounding portion 316 may be lower than the top surface of the via structure 235. Thus, the surrounding portion 316 may surround the lower sidewall of the via structure 235 that is exposed over the second surface 102 of the substrate and expose the upper sidewall of the exposed via structure 235. In here, the upper sidewall of the exposed via structure 234 may be covered by a seed pattern 355 as described later.

The second protection layer pattern 325 may be formed on the first protection layer pattern 315, and may expose a portion of the top surface of the first protection layer pattern 315 adjacent to the sidewall of the via structure 235. In particular, the second protection layer pattern 325 may be spaced apart from the sidewall of the via structure 235 by a first distance L1. That is, the second protection layer pattern 325 may cover the top surface of the protecting portion 317 of the first protection layer pattern 315 and expose the top surface of the surrounding portion 316 of the first protection layer pattern 315. The surrounding portion 316 may have a width that is equal to or about equal to the first distance L1. Thus, the portion of the top surface of the first protection layer pattern 315, the upper sidewall of the via structure 235 and a sidewall of the second protection layer pattern 325 may form a recess 340. As the recess 340 is formed around the via structure 235, the whole top surface of the protection layer pattern structure 335 may be uneven. The recess 340 may have a width that is equal to or about equal to the first distance L1.

Referring again to FIG. 1, the pad structure may contact the top surface of the exposed portion of the via structure 235, and may have a flat top surface. The pad structure may include a seed pattern 355 and a pad 370 stacked on the seed structure 355. The seed pattern 355 may include, for example, a metal such as copper, and the pad 400 may include, for example, a metal such as nickel, copper, tungsten, aluminum, tin-silver alloy, etc.

The seed pattern 355 may be formed on the protection layer pattern structure 355 and the via structure 235, and may completely or partially fill the recess 340. Thus, the seed pattern 355 may cover the portion of the top surface of the first protection layer pattern 315 that is not covered by the second protection layer pattern 325.

Referring again to FIG. 2, the seed pattern 355 may be formed on the top surface and the sidewall of the via structure 235, the top surface of the surrounding portion 316 of the first protection layer pattern 315 and the top surface and the sidewall of the second protection layer pattern 325. That is, the seed pattern 355 may be formed on a bottom and a sidewall of the recess 340 such that it completely covers the exposed top surface of the first protection layer pattern 315, thereby protecting the first protection layer pattern 315 from the environment.

The seed pattern 355 may extend in a horizontal direction parallel with the second surface 102 of the substrate 100 from the sidewall of the via structure 235 by a second distance L2 that is greater than the first distance L1. Alternatively, the seed pattern 355 may extend in the horizontal direction from the sidewall of the via structure 235 by the first distance L1.

In some embodiments, the seed pattern 355 may have a uniform thickness. That is, a bottom surface of the seed pattern 355 may have an uneven structure corresponding to the top surface of the protection layer pattern structure 335, and thus, the seed pattern may have an uneven top surface. Accordingly, the top surface of the exposed surrounding portion 316 may be completely covered by the seed pattern 355, and the seed pattern may hinder or prevent external moisture from permeating into the first protection layer pattern 315. Further, an adhesion strength between the pad structure and the via structure 235 may be increased due to the uneven structure. That is, the uneven shape of the seed pattern 355 adjacent the upper portion of the via structure 235 provides more surface area for the pad 370 to adhere to, which can increase the mechanical strength of the bond.

According to some embodiments, the upper portion of the first protection layer pattern 315 that is exposed by the second protection layer pattern 325 may be partially etched to form the recess 340, and then, the seed pattern 355 may be formed to cover the recess 340. Thus, the top surface of the exposed portion of the first protection layer pattern 315 may be protected from the environment and external moisture may be hindered or prevented from permeating into the first protection layer pattern 315. This structure thereby helps to provide a semiconductor device having a high reliability and excellent operating performance.

The pad 370 may be formed on the seed pattern 355, and may extend in the horizontal direction, i.e., parallel with the second surface 102 of the substrate 100 from the sidewall of the via structure 235, by the second distance L2. Alternatively, the pad 370 may extend in the horizontal direction from the sidewall of the via structure 235 by the first distance L1.

In some embodiments, the pad 370 may include a lower pad 372 that contacts the seed pattern 355 and an upper pad 374 that is sequentially stacked on the lower pad 372. The lower pad 372 and the upper pad 374 may include different materials from each other. For example, the lower pad 372 may include nickel, and the upper pad 374 may include gold. Thus, the lower pad 372 including nickel may reduce a total resistance of the pad 370, and the upper pad 374 including gold may improve an adhesion strength with a second conductive bump 390, as will be describe later. In some embodiments, the pad 370 may only include the lower pad 372 or a plurality of pads.

In some embodiments, the lower pad 372 may have a thickness that is greater than a thickness of the upper pad 274. Alternatively, the thickness of the lower pad 372 may be the same as or less than the thickness of the upper pad 374.

In some embodiments, the pad structure may further include a diffusion barrier layer (not shown). The diffusion barrier layer may be formed as a conformal layer on the protection layer pattern structure 335 and the via structure 235, and may hinder or prevent metal elements included in the seed pattern 355 from diffusing into the protection layer pattern structure 335 and the via structure 235. For example, the diffusion barrier layer may include a metal, such as titanium, tantalum, etc., or a metal nitride, such as titanium nitride, tantalum nitride, etc. Other materials may be used, however.

Referring again to FIG. 1, the third insulating interlayer 240 may contain the second and third wirings 250 and 260, which may contact the first wiring 190 and the via structure 235, respectively. The second and third wirings 250 and 260 may be formed in the first and second regions I and II, respectively. The third insulating interlayer 240 may include a low-k dielectric material, such as silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

The second and third wirings 250 and 260 may be formed by a double damascene process or a single damascene process in a similar manner as the first wiring 190, and may be electrically connected to each other according to the circuit layout. In example embodiments, the second wiring 250 may include a third conductive pattern 254 and a third barrier pattern 252 that partially covers the third conductive pattern 254. The third wiring 260 may include a fourth conductive pattern 264 and a fourth barrier pattern 262 that partially covers the fourth conductive pattern 264.

The first conductive bump 280 may contact the third wiring 260, and may include a metal, such as silver, copper, etc., or an alloy, such as a solder.

When the semiconductor device is formed, the first conductive bump 280 may be contained by an adhesion layer 290, and the adhesion layer 290 may adhere to a handling substrate 300. The handling substrate 300 may be, for example, a glass substrate.

As mentioned above, the seed pattern 355 may completely cover the top surface of the surrounding portion 316 of the first protection layer pattern 315 that is exposed by the second protection layer pattern 325. Thus, external moisture may be hindered/prevented from permeating into the first protection layer pattern 315, to thereby provide a semiconductor device having a high reliability and excellent operating performance.

FIGS. 3 to 9 are cross-sectional views illustrating semiconductor devices in accordance with other example embodiments. The semiconductor devices may be substantially the same as or similar to those illustrated with reference to FIGS. 1 and 2, respectively, except for the shapes of the via structure and/or seed pattern. The semiconductor devices in FIGS. 3 to 9 may be substantially the same as or similar to those illustrated in FIGS. 1 and 2, except for the A portion in FIG. 1. For the convenience of explanation, only an enlarged view of the A portion in FIG. 1 will be illustrated in FIGS. 3 to 9. Thus, same reference numerals will be used to refer to the same or like elements, and any further repetitive explanation concerning the above elements will be omitted.

Figure 3:
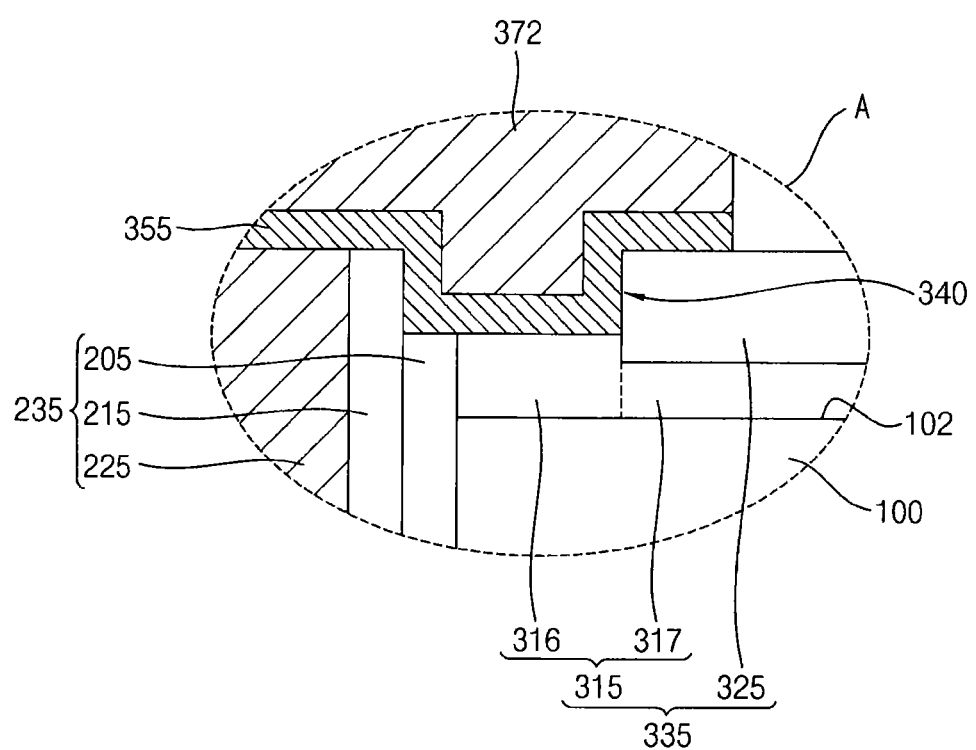

Referring to FIG. 3, the semiconductor device may include a via electrode including a second conductive pattern 225 and a second barrier pattern 215 on the second conductive pattern 225. An insulation layer pattern 205 surrounds the via electrode including the second conductive pattern 225 and the second barrier pattern 215. A top surface of the insulation layer pattern 205 may be lower than a top surface of the via electrode. That is, the top surface of the insulation layer pattern 205 may be lower than top surfaces of the second barrier pattern 215 and the second conductive pattern 225. Thus, an upper sidewall of the second barrier pattern 215 may be exposed by the insulation layer pattern 205, and the exposed upper sidewall of the second barrier pattern 215 may be covered by a seed pattern 355.

In FIG. 3, the top surface of the insulation layer pattern 205 may be coplanar with a top surface of a first protection layer pattern 315, however, the inventive concepts may not be limited thereto, and the top surface of the insulation layer pattern 205 may be higher or lower than the top surface of the first protection layer pattern 315.

Figure 4:
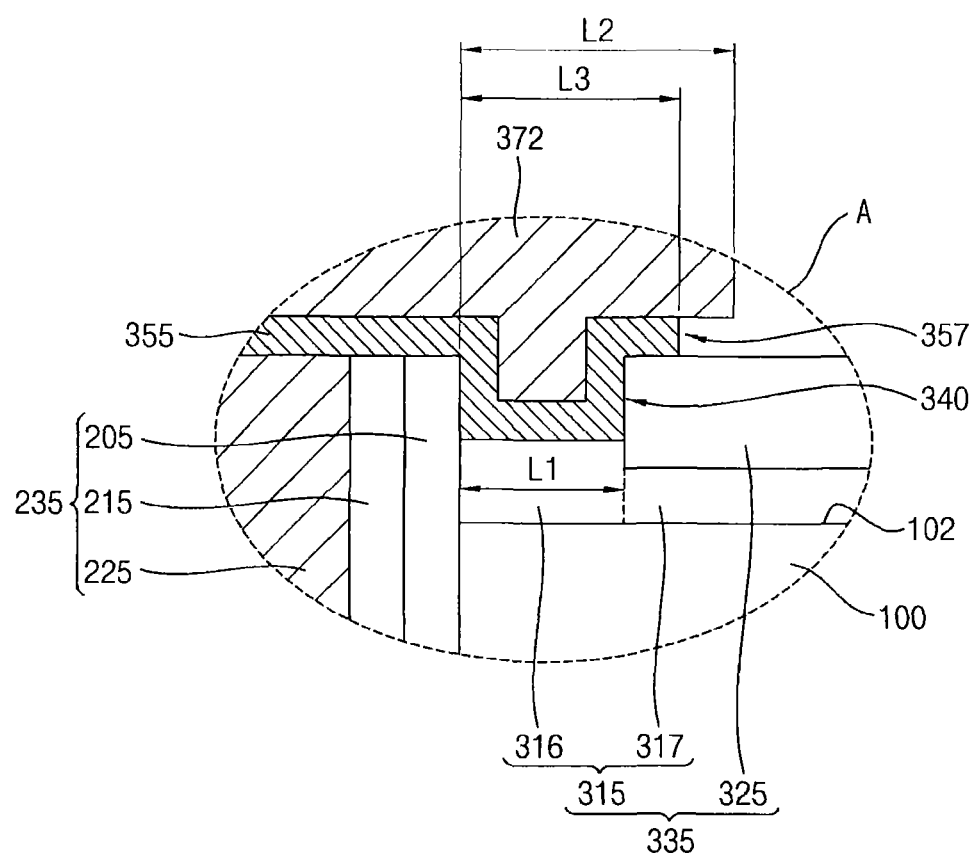

Referring to FIG. 4, the semiconductor device may include a protection layer pattern 335 and a pad structure on a via structure 235, and the pad structure may include a seed pattern 355 and a pad 370.

A second protection layer pattern 325 may extend in a horizontal direction parallel with a second surface 102 of the substrate 100 from a sidewall of the via structure 235 by a first distance L1. The pad 370 may extend in the horizontal direction from the sidewall of the via structure 235 by a second distance L2 that is greater than the first distance L1.

The seed pattern 355 may extend in the horizontal direction from the sidewall of the via structure 235 by a third distance L3. In this case, the third distance L3 may be greater than the first distance L1 and less than the second distance L2. That is, a width (planar area) of the seed pattern 355 may be less than a width of the pad 370, so that the seed pattern 355 may not cover a portion of a bottom surface of the pad 370. Accordingly, the seed pattern 355 may cover a relatively smaller area of a top surface of the second protection layer pattern 325, when compared with the semiconductor device as described with reference to FIG. 1.

For example, when a seed layer is etched by a wet etching process to form the seed pattern 355, the seed layer may be etched more inwardly from the sidewall of the pad 370 to form a second recess 357, so that the seed pattern 355 may be formed to have the width less than the width of the pad 370. The second recess 357 may expose a sidewall of the seed pattern 355 and a portion of the bottom surface of the pad 370. The exposed bottom surface of the pad 370 may be spaced apart from the top surface of the second protection layer pattern 325. Even in this case, a top surface of a first protection layer pattern 315 exposed by the second protection layer pattern 325 may be completely covered by the seed pattern 355, thereby reducing or preventing the external moisture from permeating into the first protection layer pattern 315.

Figure 5:
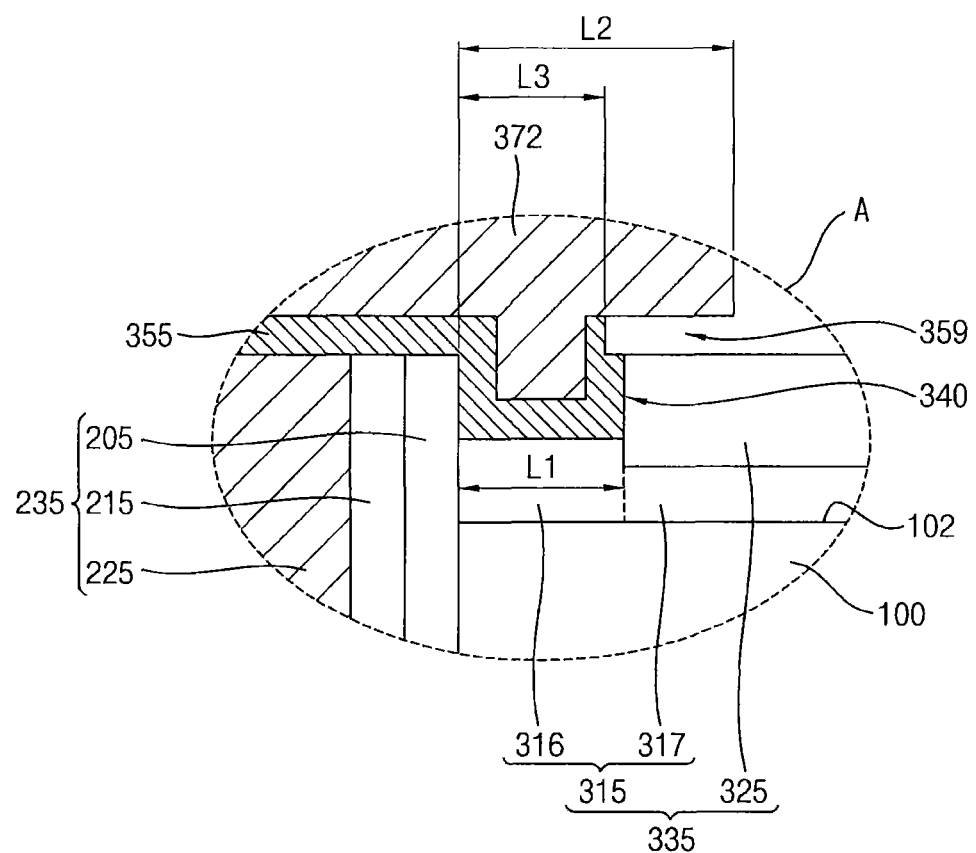

Referring to FIG. 5, the semiconductor device may include a protection layer pattern 335 and a pad structure on a via structure 235, and the pad structure may include a seed pattern 355 and a pad 370 that are sequentially stacked.

A second protection layer pattern 325 may extend in a horizontal direction parallel with a second surface 102 of the substrate 100 from a sidewall of the via structure 235 by a first distance L1. The pad 370 may extend in the horizontal direction from the sidewall of the via structure 235 by a second distance L2 that is greater than the first distance L1.

The seed pattern 355 may extend in the horizontal direction from the sidewall of the via structure 235 by the first distance L1, and an outer upper portion of the seed pattern 355 may extend to be spaced apart from the via structure 235 by a third distance L3 that is less than the first distance L2. Accordingly, the seed pattern 355 may not cover a top surface of the second protection layer pattern 325.

For example, when a seed layer is etched by a wet etching process to form the seed pattern 355, the seed layer may be etched more inwardly from the sidewall of the pad 370 to form a third recess 359, so that the seed pattern 355 may be formed to have the width less than the width of the pad 370. The third recess 359 may expose portions of a sidewall and an upper surface of the seed pattern 355 and a portion of the bottom surface of the pad 370. In this case, the seed pattern 355 may be etched more inwardly from the sidewall of the pad 370, when compared with the semiconductor device as described with reference to FIG. 4. Accordingly, an outer lower portion of the seed pattern 355 may extend in the horizontal direction by the first distance L1, and the outer upper portion of the seed pattern 355 protruding from the top surface of the second protection layer pattern 355 may extend in the horizontal direction by the third distance L3 less than the first distance L1. That is, a width of the upper portion of the seed pattern 355 may be less than a width of the lower portion of the seed pattern 355. Even in this case, a top surface of a first protection layer pattern 315 exposed by the second protection layer pattern 325 may be completely covered by the seed pattern 355, thereby reducing or preventing the external moisture from permeating into the first protection layer pattern 315.

Figure 6:
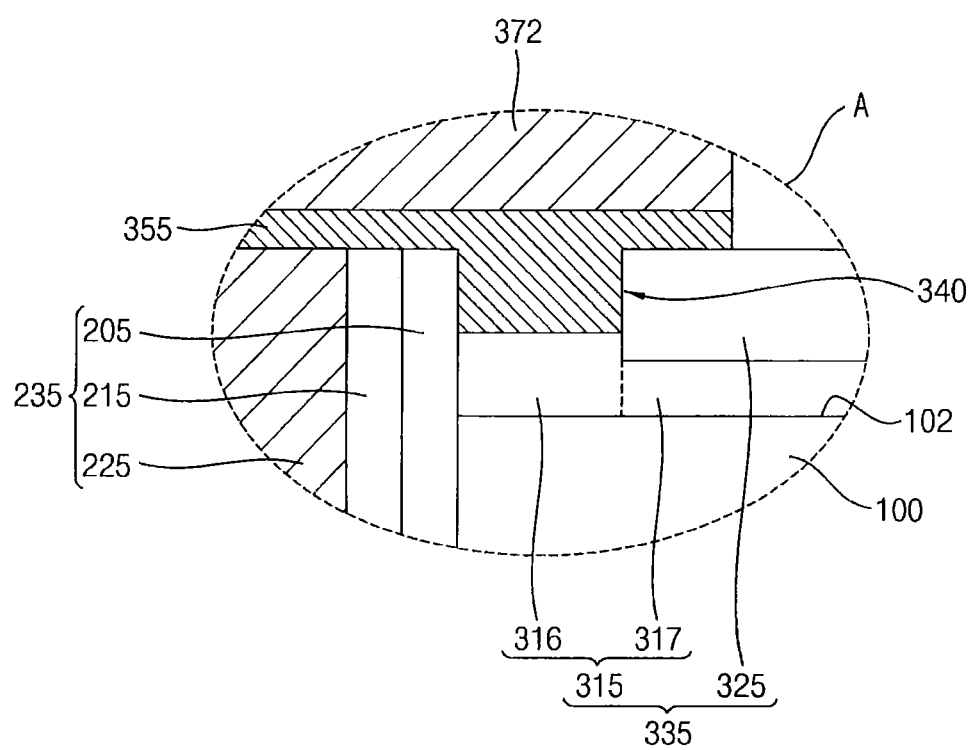

Referring to FIG. 6, the semiconductor device may include a seed pattern 355 having a flat top surface. A bottom surface of the seed pattern 355 may have an uneven structure corresponding to top surfaces of a protection layer pattern structure 335 and a via structure 235. A top surface of the seed pattern 355 may have a constant height. Thus, the seed pattern 355 may have a first thickness on the top surface of the via structure 235 and a second thickness on a first protection layer pattern 315 different from the first thickness. For example, when a seed layer is formed by a deposition process, the seed layer may be formed to sufficiently fill a first recess 340 (see FIG. 19), so that the seed pattern 355 may be formed to have the flat top surface.

Figure 7:
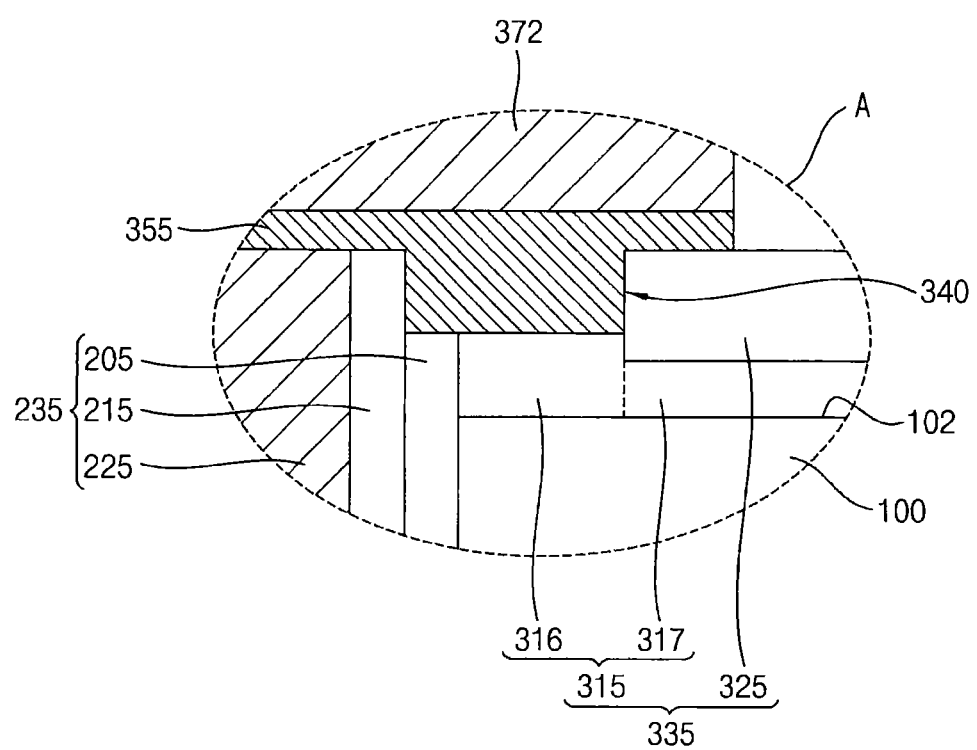
Figure 8:
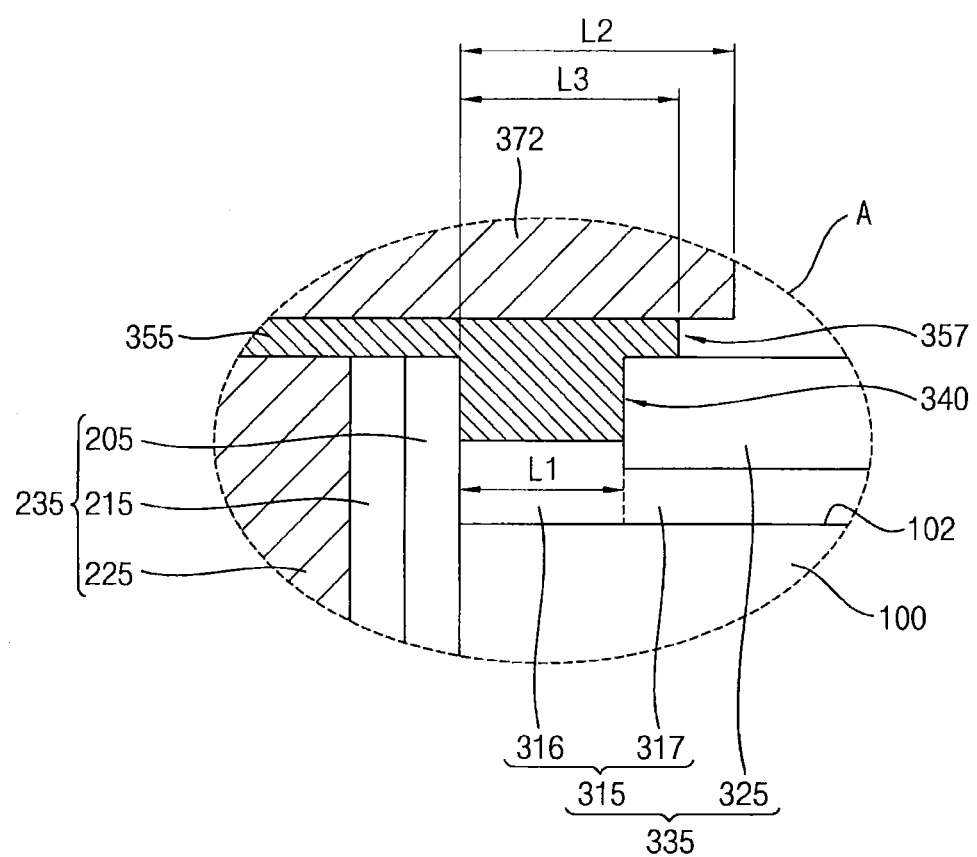
Figure 9:
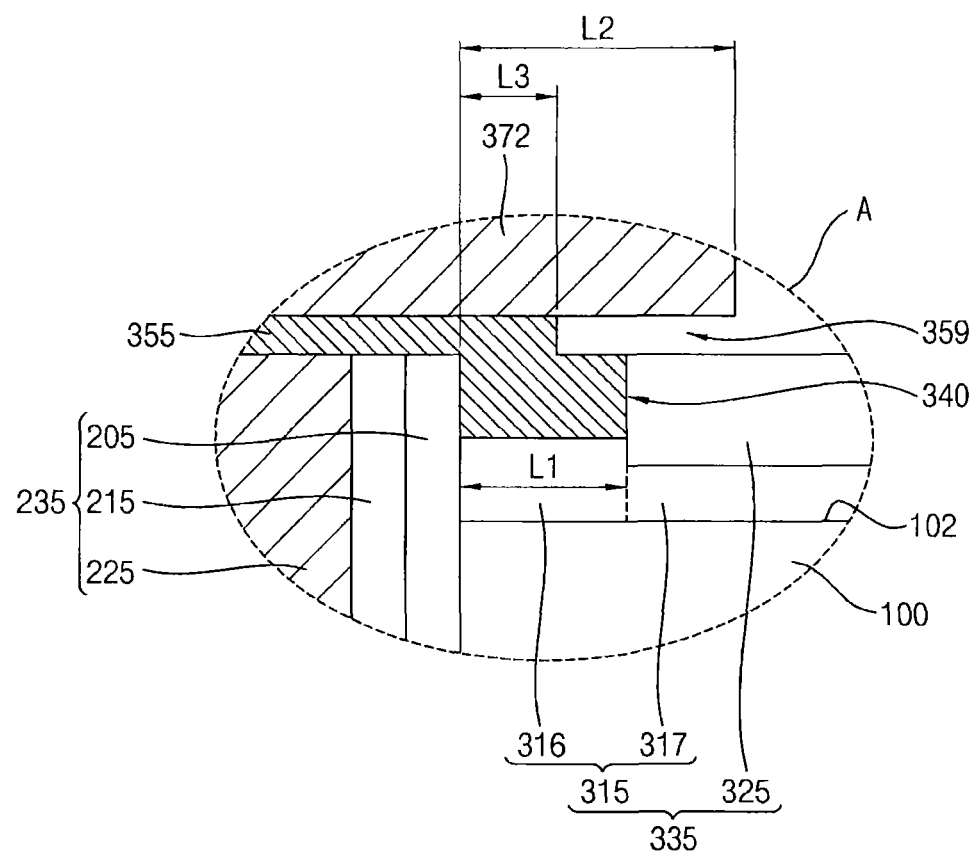

Referring to FIGS. 7 to 9, seed patterns 355 having flat top surfaces may be formed to have various shapes. In some embodiments, a top surface of an insulation layer pattern 205 may be lower than a top surface of a via electrode (see FIG. 7). In other embodiments, a recess 357, 359 may be provided between a pad 370 and a second protection layer pattern 325, so that a width of the seed pattern 355 may be less than a width of the pad 370 (see FIGS. 8 and 9). In these cases, the seed pattern 355 may cover a relatively smaller area of a top surface of the second protection layer pattern 325, when compared with the semiconductor device as described with reference to FIG. 1 (see FIG. 8), and the seed pattern 355 may not cover the top surface of the second protection layer pattern 325 (see FIG. 9). Even in these cases, a top surface of a first protection layer pattern 315 exposed by the second protection layer pattern 325 may be completely covered by the seed pattern 355, thereby reducing or preventing the external moisture from permeating into the first protection layer pattern 315.

Hereinafter, a method of manufacturing the semiconductor device in FIG. 1 will be explained.

FIGS. 10 to 22 are cross-sectional views illustrating methods of manufacturing a semiconductor device in accordance with various embodiments.

Figure 10:
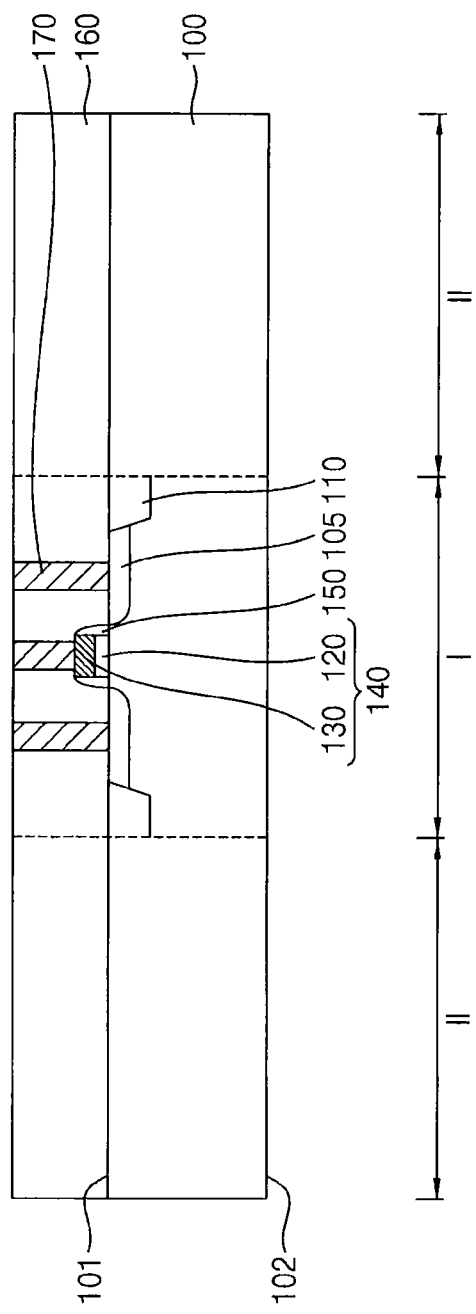

Referring to FIG. 10, circuit elements and a contact plug 170 may be formed on a substrate 100 having an isolation layer 110 thereon.

The substrate 100 may include silicon, germanium, silicon-germanium, or III-V compounds, e.g., GaP, GaAs, GaSb, etc. In some embodiments, the substrate 100 may be a silicon-on-insulator (SOI) substrate, or a germanium-on-insulator (GOI) substrate.

The substrate 100 may have a first surface 101 and a second surface 102 opposite to the first surface 101. The substrate 100 may include a first region I and a second region II. In example embodiments, the first region I may be a circuit region in which the circuit elements may be formed, and the second region II may be a via region in which a via structure 230 (refer to FIG. 10) may be formed.

The first region I may include a cell region (not shown) in which memory cells may be formed, a peripheral circuit region (not shown) in which peripheral circuits for driving the memory cells may be formed, and a logic region in which logic devices may be formed.

For example, the isolation layer 110 may be formed by a shallow trench isolation (STI) process, and include an insulating material, such as silicon oxide.

A transistor serving as the circuit element may be formed by a following method.

In particular, after sequentially forming a gate insulation layer and a gate electrode layer on the first surface 101 of the substrate 100 having the isolation layer 110 thereon, the gate electrode layer and the gate insulation layer may be patterned by a photolithography process to form a gate structure 140 including a gate insulation layer pattern 120 and a gate electrode 130 sequentially stacked on the first surface 101 of the substrate 100 in the first region I. The gate insulation layer may be formed to include an oxide, e.g., silicon oxide or a metal oxide, and the gate electrode layer may be formed to include, e.g., doped polysilicon, a metal, a metal nitride and/or a metal silicide.

A gate spacer layer may be formed on the substrate 100 and the isolation layer 110 to cover the gate structure 140, and may be anisotropically etched to form a gate spacer 150 on a sidewall of the gate structure 140. The gate spacer layer may be formed to include a nitride, such as silicon nitride.

Impurities may be implanted into an upper portion of the substrate 100 to form a first impurity region 105, so that the transistor including the gate structure 140 and the first impurity region 105 may be formed.

In example embodiments, a plurality of transistors may be formed on the substrate 100 in the first region I. The circuit elements may not be limited to the transistor, but various types of circuit elements, e.g., diodes, resistors, inductors, capacitors, etc. may be formed.

A first insulating interlayer 160 may be formed on the substrate 100 to cover the circuit elements, and a contact plug 170 may be formed through the first insulating interlayer 160 to contact the first impurity region 105. Alternatively, the contact plug 170 may be formed through the first insulating interlayer 160 to contact the gate structure 140.

The first insulating interlayer 160 may be formed to include an oxide, e.g., silicon oxide. The contact plug 170 may be formed by forming a contact hole (not shown) through the first insulating interlayer 160 to expose the first impurity region 105, forming a conductive layer on the exposed first impurity region 105 and the first insulating interlayer 160 to fill the contact hole, and planarizing an upper portion of the conductive layer until a top surface of the first insulating interlayer 160 may be exposed. The conductive layer may be formed to include, e.g., a metal, a metal nitride, a metal silicide, doped polysilicon, etc.

Figure 11:
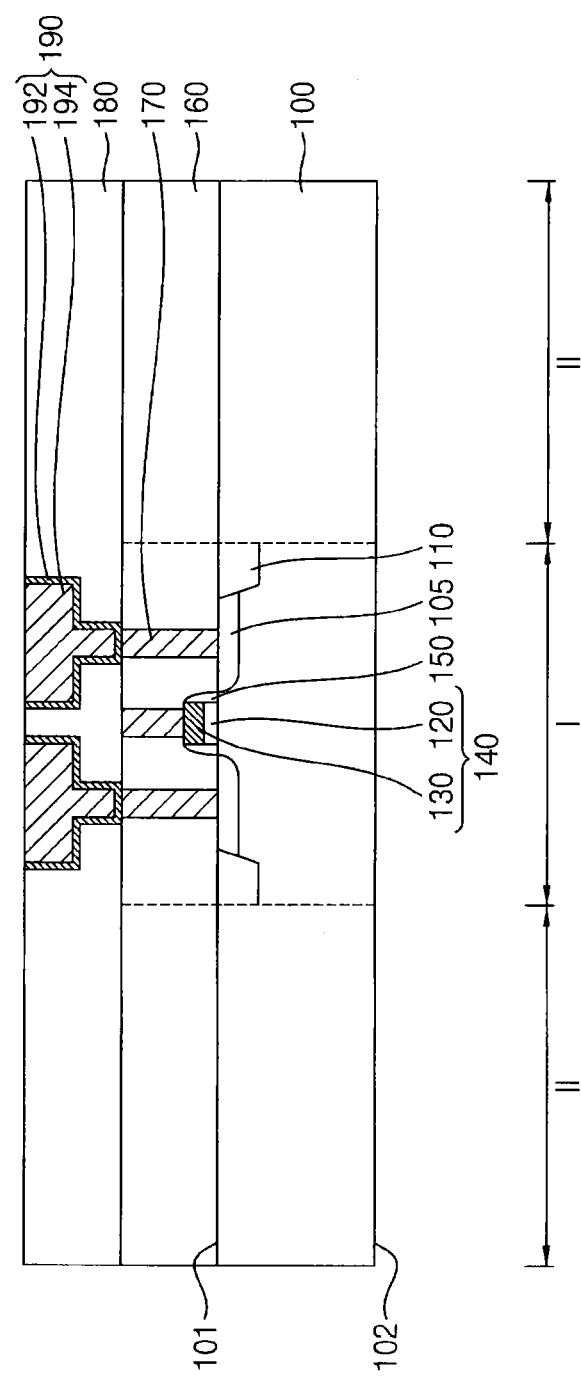

Referring to FIG. 11, a second insulating interlayer 180 may be formed on the first insulating interlayer 160 and the contact plug 170, and at least one first wiring 190 may be formed through the second insulating interlayer 180 in the first region I.

The second insulating interlayer 180 may be formed to include a low-k dielectric material, e.g., silicon oxide doped with fluorine or carbon, a porous silicon oxide, spin on organic polymer, or an inorganic polymer, such as hydrogen silsesquioxane (HSSQ), methyl silsesquioxane (MSSQ), etc.

In example embodiments, the first wiring 190 may be formed by a double damascene process as follows.

After partially removing the second insulating interlayer 180 to form a via hole (not shown) therethrough, which may expose top surfaces of the first insulating interlayer 160 and the contact plug 170, an upper portion of the second insulating interlayer 180 may be removed to form a first trench (not shown) being in communication with the via hole and having a diameter greater than that of the via hole. Alternatively, after forming the first trench, the via hole may be formed later. A first barrier layer may be formed on inner walls of the via hole and the first trench and the exposed top surfaces of the first insulating interlayer 160 and the contact plug 170, and a first conductive layer may be formed on the first barrier layer to sufficiently fill remaining portions of the via hole and the first trench. Upper portions of the first barrier layer and the first conductive layer may be planarized until a top surface of the second insulating interlayer 180 may be exposed to form the first wiring 190 contacting the top surface of the contact plug 170 in the first region I. The first wiring 190 may be formed to include a first conductive pattern 194 and a first barrier pattern 192 surrounding a bottom and a sidewall of the first conductive pattern 194.

The first barrier layer may be formed to include a metal nitride, e.g., titanium nitride, tantalum nitride, tungsten nitride, copper nitride, aluminum nitride, etc., and the first conductive layer may be formed to include a metal, e.g., copper, aluminum, tungsten, titanium, tantalum, etc. When the first conductive layer is formed using copper or aluminum, a seed layer (not shown) may be formed on the first barrier layer, and the first conductive layer may be formed by an electroplating process.

As illustrated above, the first wiring 190 may be formed by a double damascene process, and thus may be formed to have a lower portion and an upper portion connected thereto. Alternatively, the first wiring 190 may be formed by a single damascene process. In this case, the first wiring 190 may have a substantially constant width from a bottom portion toward a top portion thereof. Hereinafter, for the convenience of explanations, only the first wiring 190 formed by a double damascene process as shown in FIG. 9 will be illustrated.

In FIG. 11, the first wiring 190 may be formed through the single second insulating interlayer 180, however, more insulating interlayers may be further formed on the second insulating interlayer 180 and more first wirings 190 may be formed through each of the insulating interlayers.

Figure 12:
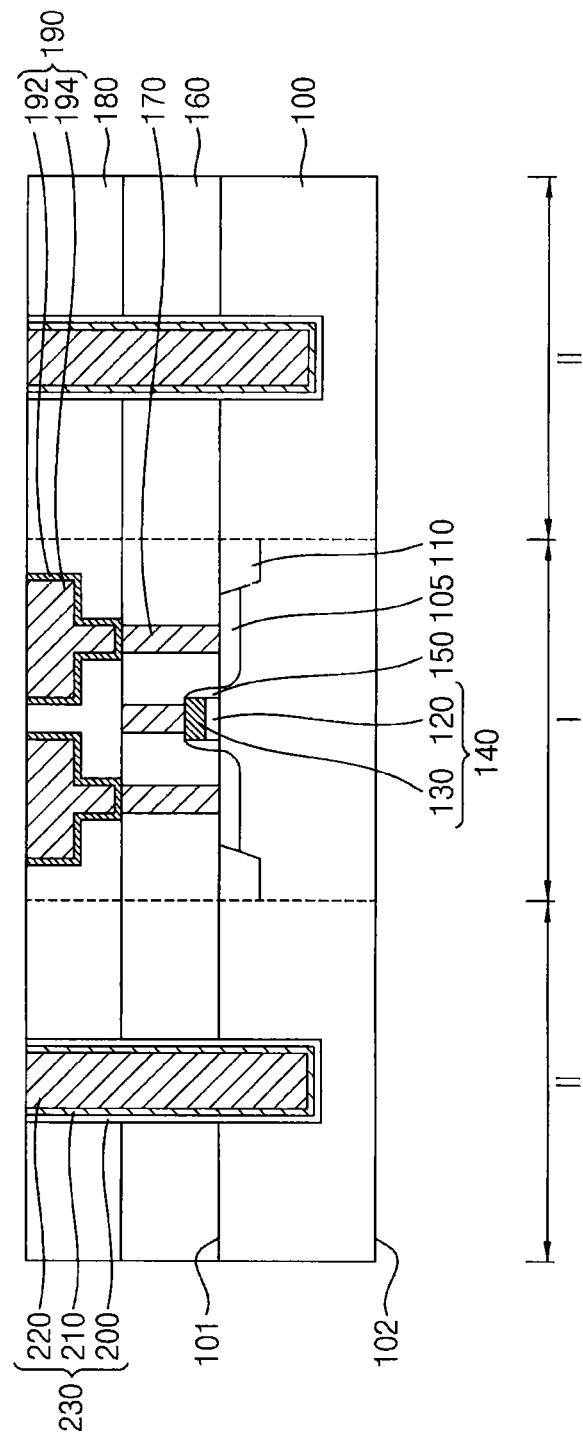

Referring to FIG. 12, a preliminary via structure 230 may be formed through a portion of the substrate 100.

Particularly, a first photoresist pattern (not shown) covering the first region I of the substrate 100 and partially exposing the second region II of the substrate 100 may be formed on the second insulating interlayer 180 and the first wiring 190, and the first and second insulating interlayers 160 and 180 and the substrate 100 may be etched using the first photoresist pattern as an etching mask to form a second trench (not shown). The second trench may be formed through the first and second insulating interlayers 160 and 180 and the portion of the substrate 100.

An insulation layer 200 and a second barrier layer 210 may be sequentially formed on an inner wall of the second trench, the second insulating interlayer 180 and the first wiring 190, and a second conductive layer 220 may be formed on the second barrier layer 210 to sufficiently fill the second trench. The insulation layer 200 may be formed to include an oxide, e.g., silicon oxide or a nitride, e.g., silicon nitride, and the second barrier layer 210 may be formed to include a metal nitride, e.g., titanium nitride, tantalum nitride, tungsten nitride, copper nitride, aluminum nitride, etc. The second conductive layer 220 may be formed to include a metal, e.g., copper, aluminum, tungsten, etc., or doped polysilicon. When the second conductive layer 220 is formed to include copper or aluminum, a second seed layer (not shown) may be formed on the second barrier layer 210, and the second conductive layer 220 may be formed by an electroplating process.

The second conductive layer 220, the second barrier layer 210 and the insulation layer 200 may be planarized until a top surface of the second insulating interlayer 180 may be exposed to form the preliminary via structure 230 filling the second trench. The preliminary via structure 230 may include the insulation layer 200, the second barrier layer 210 and the second conductive layer 220.

Figure 13:
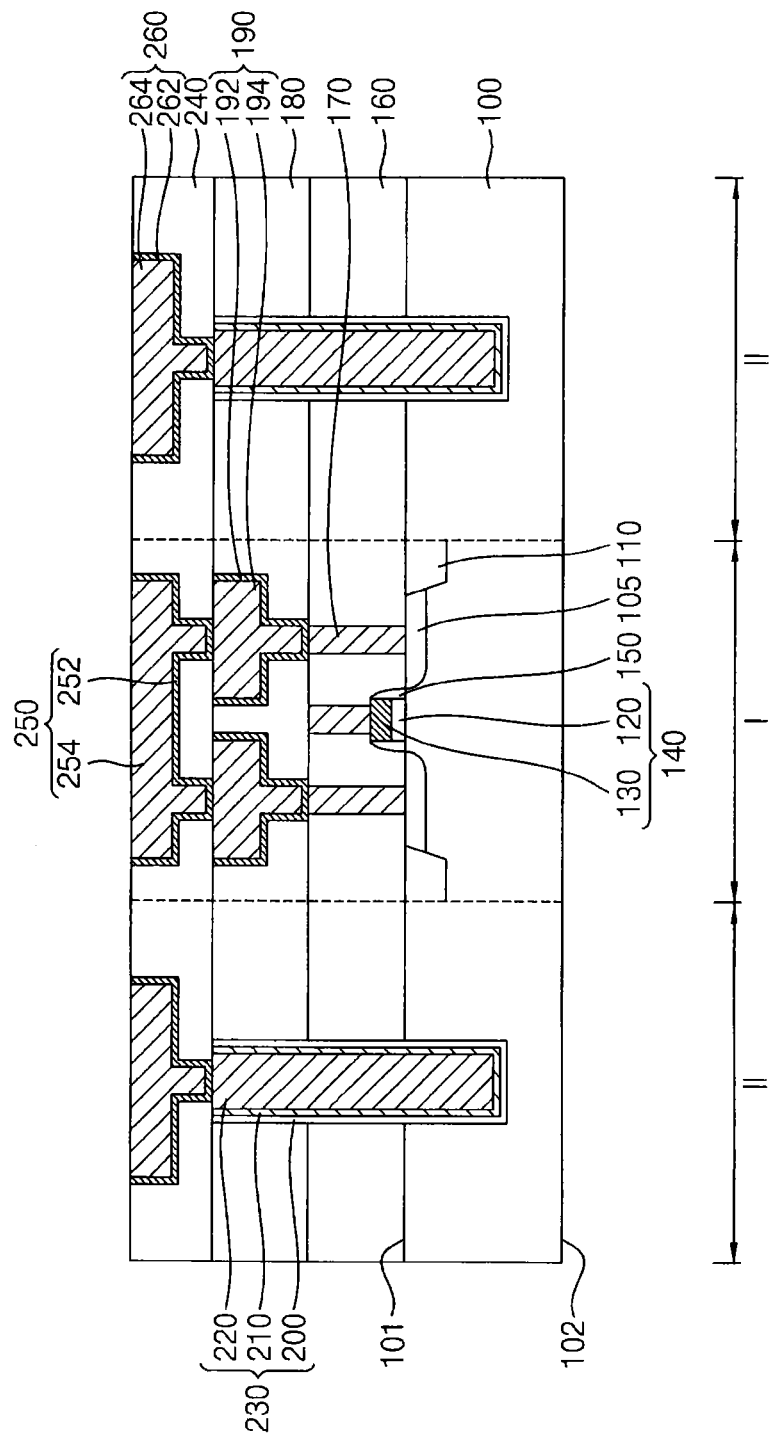

Referring to FIG. 13, a third insulating interlayer 240 may be formed on the second insulating interlayer 180, the first wiring 190 and the preliminary via structure 230, and second and third wirings 250 and 260 may be formed through the third insulating interlayer 240 in the first and second regions I and II, respectively.

The third insulating interlayer 240 may be formed to include a low-k dielectric material, e.g., silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

The second and third wirings 250 and 260 may be formed by a double damascene process or a single damascene process, as the first wiring 190. In example embodiments, the second wiring 250 may be formed to contact a top surface of the first wiring 190, and the third wiring 260 may be formed to contact a top surface of the preliminary via structure 230. According to the circuit layout, the second and third wirings 250 and 260 may be formed to be electrically connected to each other.

In example embodiments, the second wiring 250 may be formed to include a third conductive pattern 254 and a third barrier pattern 252 covering a bottom and a sidewall of the third conductive pattern 254, and the third wiring 260 may be formed to include a fourth conductive pattern 264 and a fourth barrier pattern 262 covering a bottom and a sidewall of the fourth conductive pattern 264.

Figure 14:
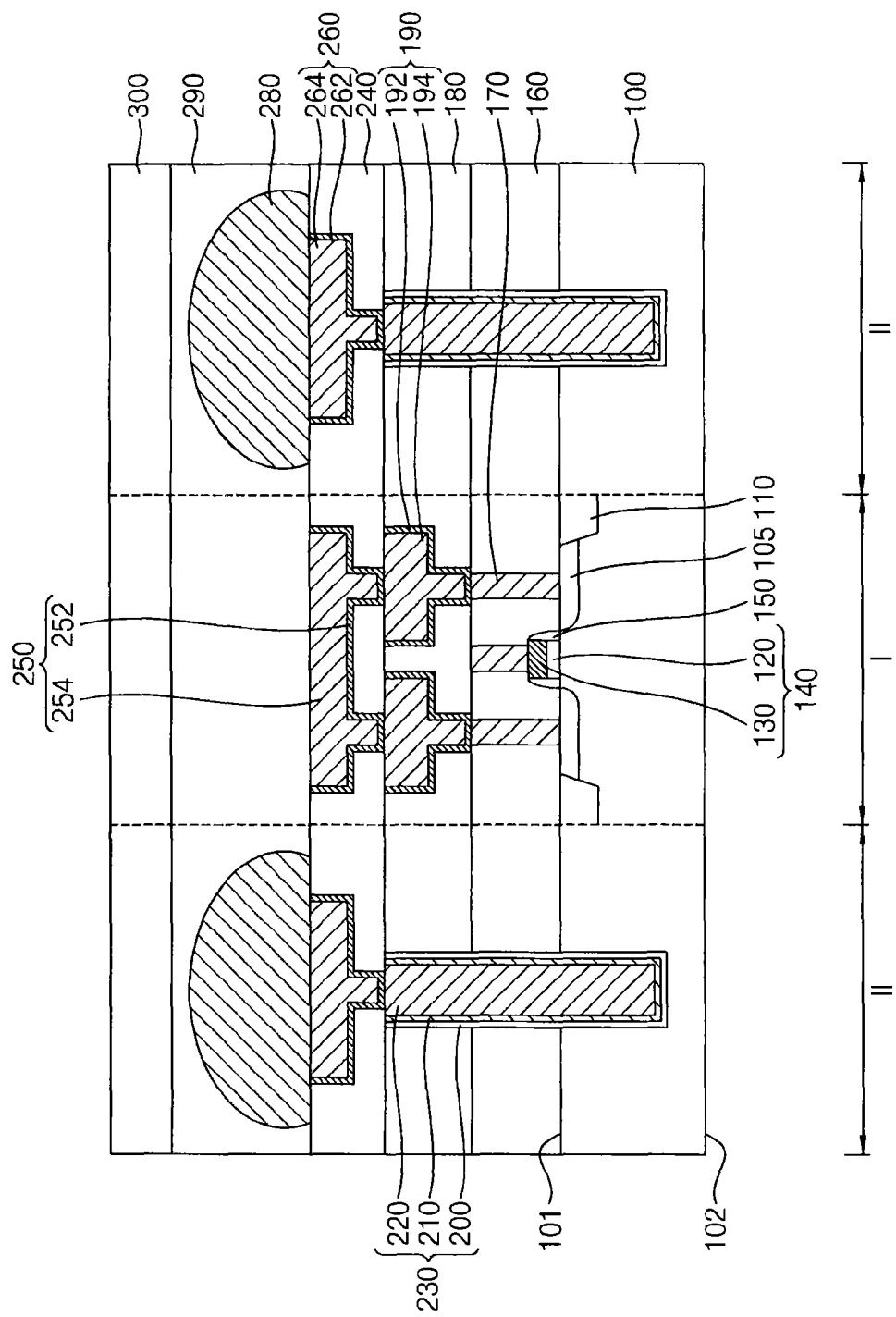

Referring to FIG. 14, after a first conductive bump 280 may be formed on the third insulating interlayer 240 to contact a top surface of the third wiring 260, an adhesion layer 290 may be formed on the third insulating interlayer 240 and the second wiring 250, and may adhere to a handling substrate 300.

The first conductive bump 280 may be formed to include a metal, e.g., silver, copper, etc., or an alloy, e.g., solder. The handling substrate 300 may be, e.g., a glass substrate.

Figure 15:
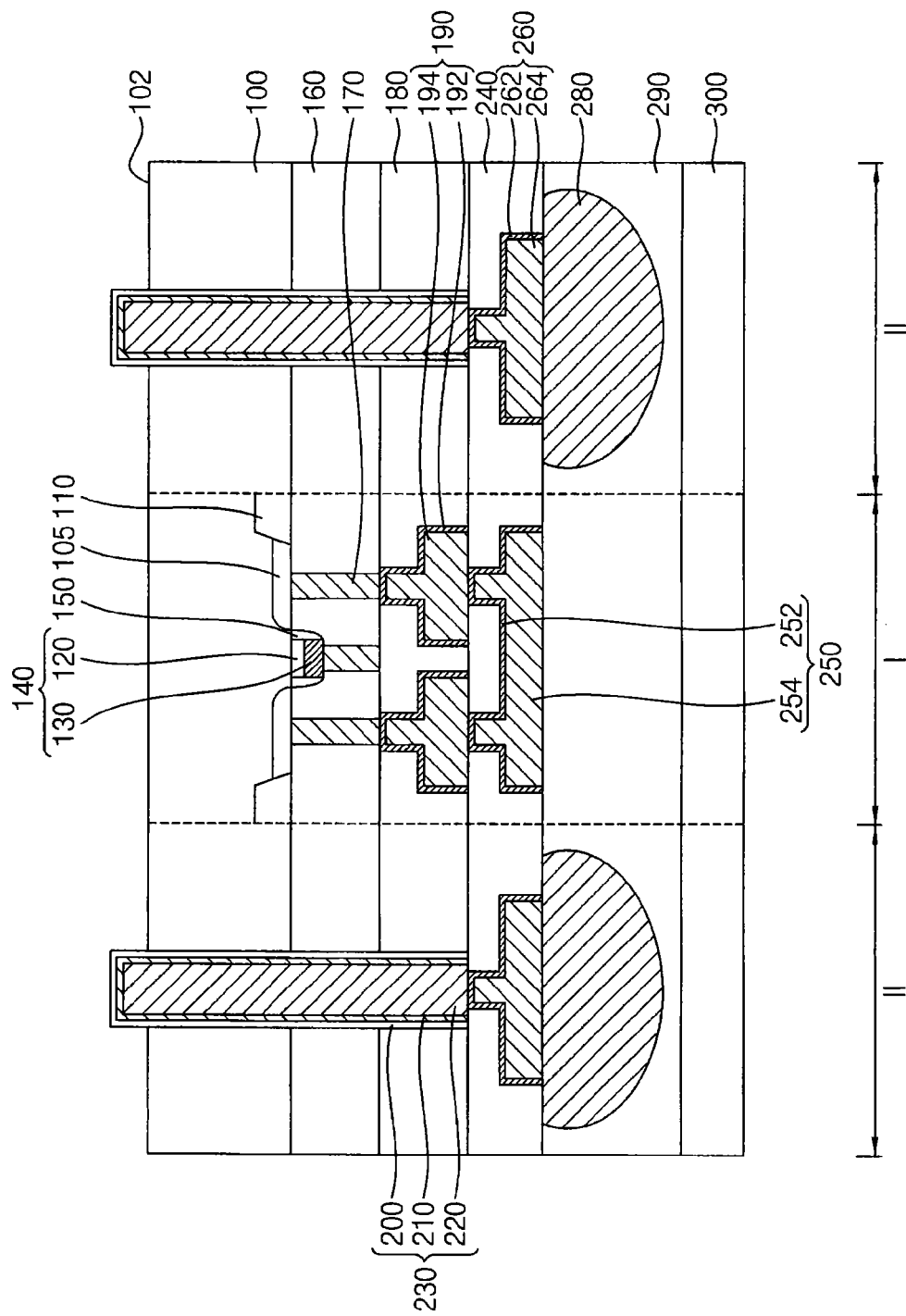

Referring to FIG. 15, the substrate 100 may be overturned using the handling substrate 300 so that the second surface 102 of the substrate 100 may face upward. A portion of the substrate 100 adjacent to the second surface 102 may be removed to expose a portion of the preliminary via structure 230. Thus, the substrate 100 may be partially removed by, e.g., an etch back process.

Figure 16:
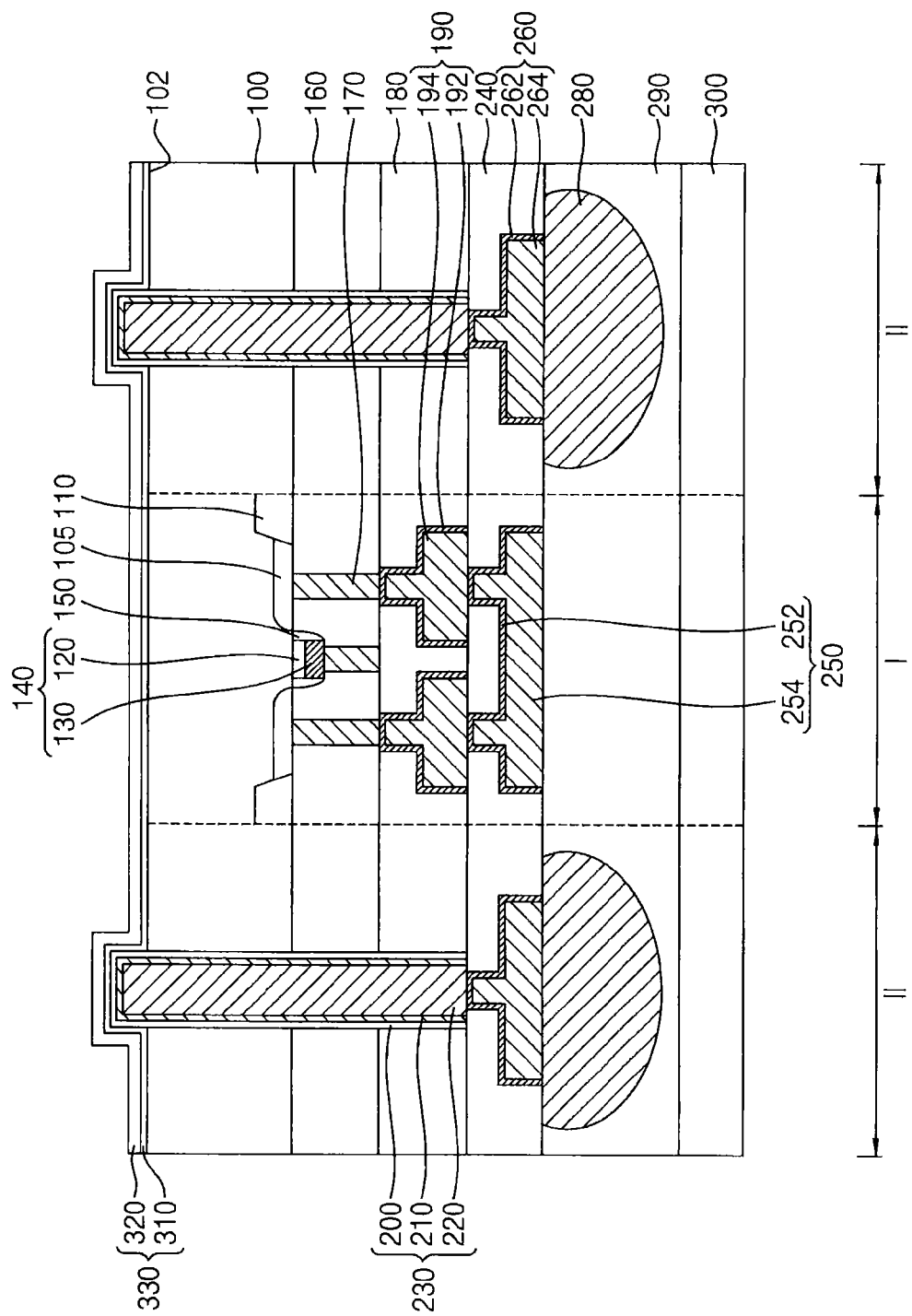

Referring to FIG. 16, a protection layer structure 330 may be formed on the second surface 102 of the substrate 100 and the exposed portion of the preliminary via structure 230.

In example embodiments, the protection layer structure 330 may be formed to include a first protection layer 310 and a second protection layer 320 sequentially stacked. In an example embodiment, the first protection layer 310 and the second protection layer 320 may be formed using materials having different etch selectivity with respect to each other. For example, when the first protection layer 310 includes silicon oxide, the second protection layer 320 may include silicon nitride. Alternatively, when the first protection layer 310 includes silicon nitride, the second protection layer 320 may include silicon oxide.

In some embodiments, a third protection layer (not shown) may be additionally formed on the second protection layer 320. In this case, the protection layer structure 330 may include the first protection layer 310, the second protection layer 320 and the third protection layer sequentially stacked. In a subsequent process illustrated with reference to FIG. 17, the third protection layer may be removed, and thus, only a first protection layer pattern 315 and a second protection layer pattern 325 may remain.

Figure 17:
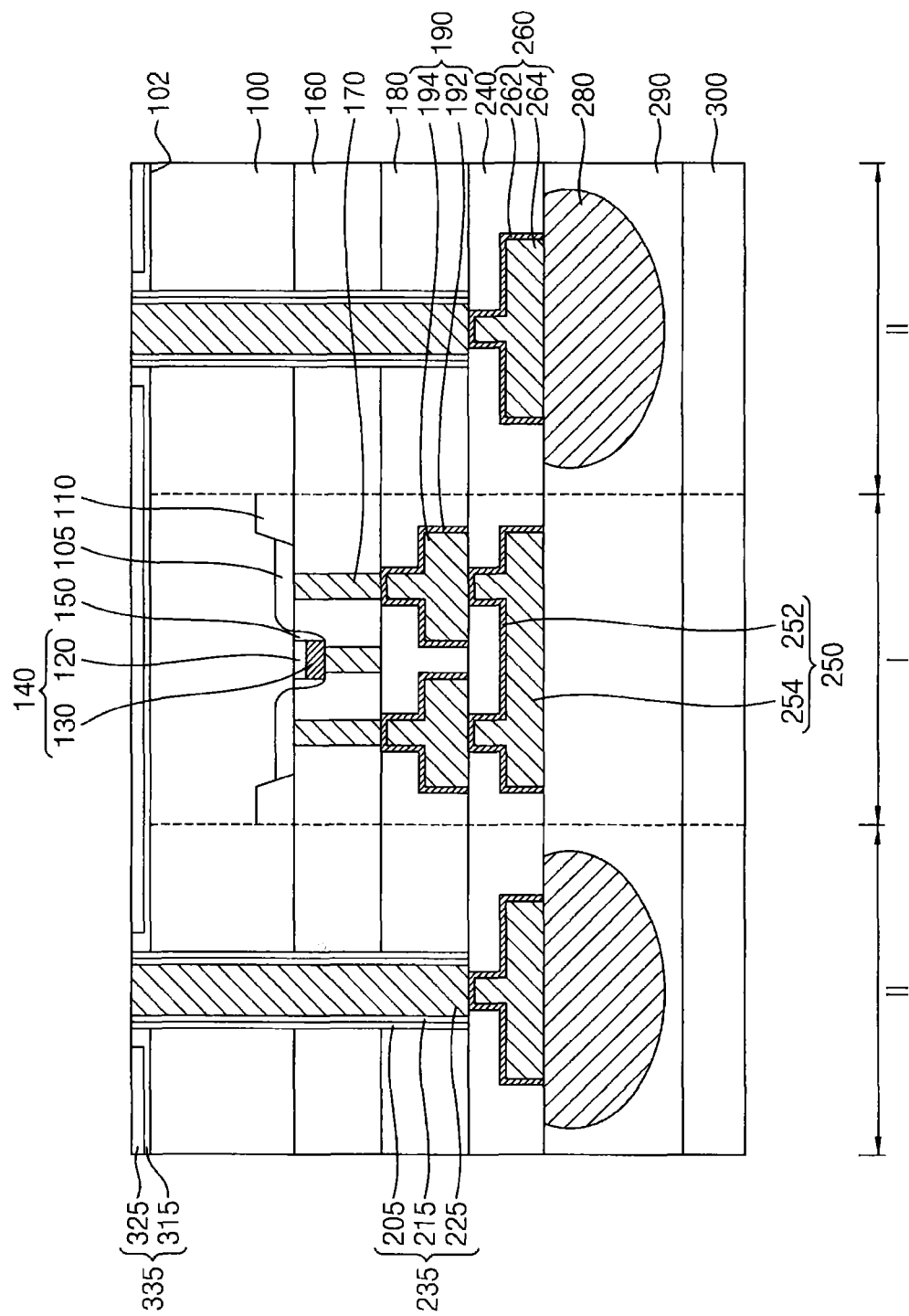

Referring to FIG. 17, an upper portion of the protection layer structure 330 and an upper portion of the preliminary via structure 230 may be planarized to form a protection layer pattern structure 335 and a via structure 235. Thus, a top surface of the via structure 235 may be exposed. For example, the planarization process may be performed by a chemical mechanical polishing (CMP) process.

The via structure 235 may include a via electrode and an insulation layer pattern 205 surrounding a sidewall of the via electrode, and the via electrode may include a second conductive pattern 225 and a second barrier pattern 215 surrounding a sidewall of the second conductive pattern 225.

In example embodiments, a top surface of the second conductive pattern 225 may be substantially coplanar with top surfaces of the second barrier pattern 215 and the insulation layer pattern 205.

The protection layer pattern structure 335 may include a first protection layer pattern 315 and a second protection layer pattern 325 sequentially stacked on the second surface 102 of the substrate 100, and may surround a sidewall of the via structure 235 exposed over the second surface 102 of the substrate 100.

The first protection layer pattern 315 may be formed on the second surface 102 of the substrate 100, and may surround the sidewall of the exposed via structure 235 over the second surface 102 of the substrate. In here, an upper portion of the first protection layer pattern 315 contacting the sidewall of the via structure 235 may be exposed.

The second protection layer pattern 325 may be formed on the first protection layer pattern 315, and may partially expose a portion of the first protection layer pattern 315. The second protection layer pattern 325 may be spaced apart from the via structure 235 by the portion of the first protection layer pattern 315 contacting the sidewall of the via structure 235 such that the second protection layer pattern 325 may not directly contact the via structure 325.

Figure 18:
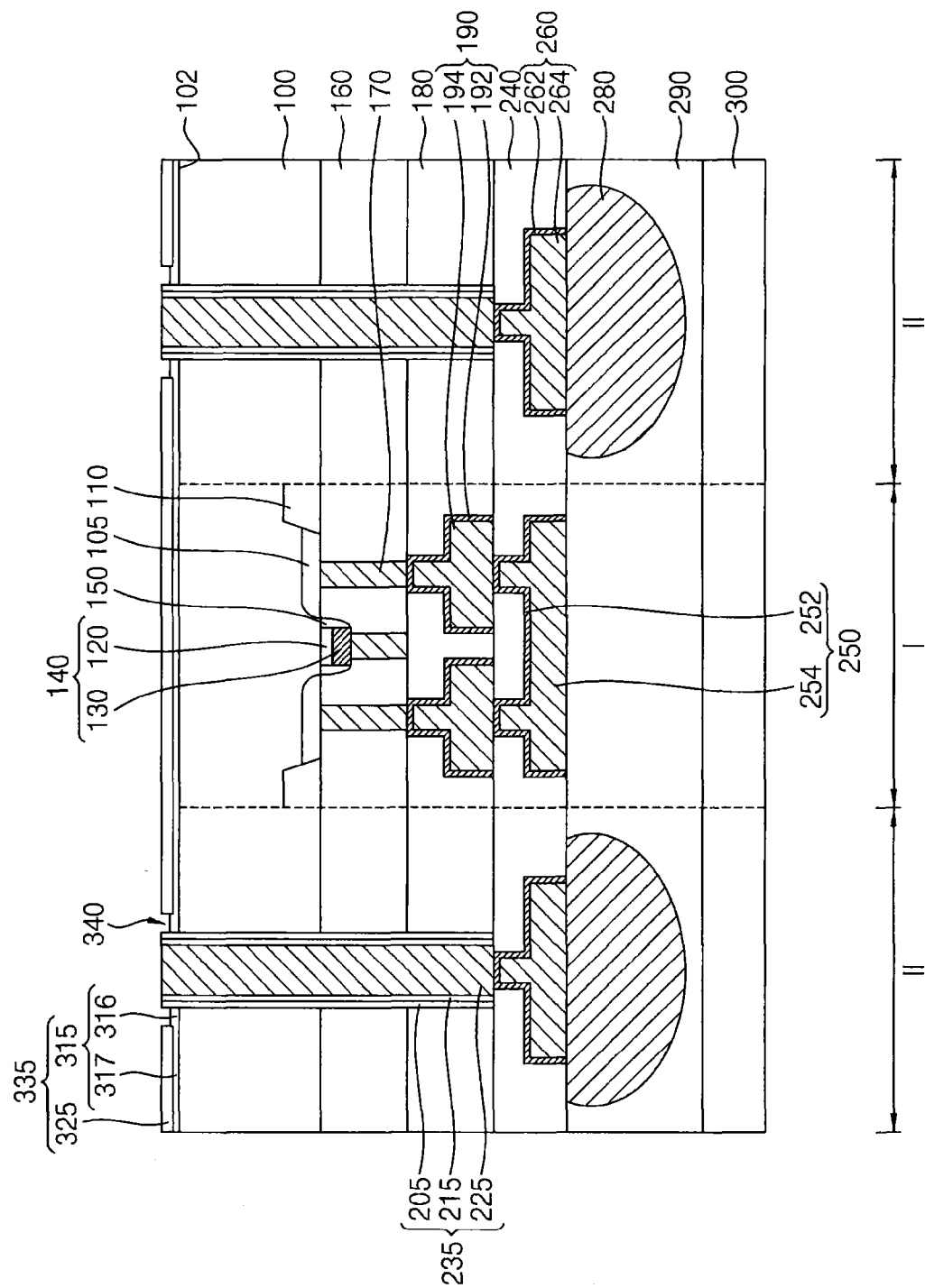

Referring to FIG. 18, the portion of the first protection layer pattern 315 exposed by the second protection layer pattern 325 may be partially removed to form a recess 340.

The exposed upper portion of the first protection layer pattern 315 may be partially removed by a wet etching process or a dry etching process. For example, the wet etching process may be performed using an etching solution having a high etching rate for the first protection layer pattern 315 to partially remove the exposed upper portion of the first protection layer pattern 315. Thus, the first protection layer pattern 315 may be formed to include a surrounding portion 316 surrounding a lower sidewall of the via structure 235 and a protecting portion 317 around the surrounding portion 316. The surrounding portion 316 may expose an upper sidewall of the via structure 235. The exposed upper sidewall of the via structure 235, a top surface of the surrounding portion 316 and a sidewall of the second protection layer pattern 325 may form the recess 340. The exposed upper portion of the first protection layer pattern 315 may be partially removed to form the recess 340, so that the whole top surface of the protection layer pattern structure 335 may be uneven.

Figure 19:
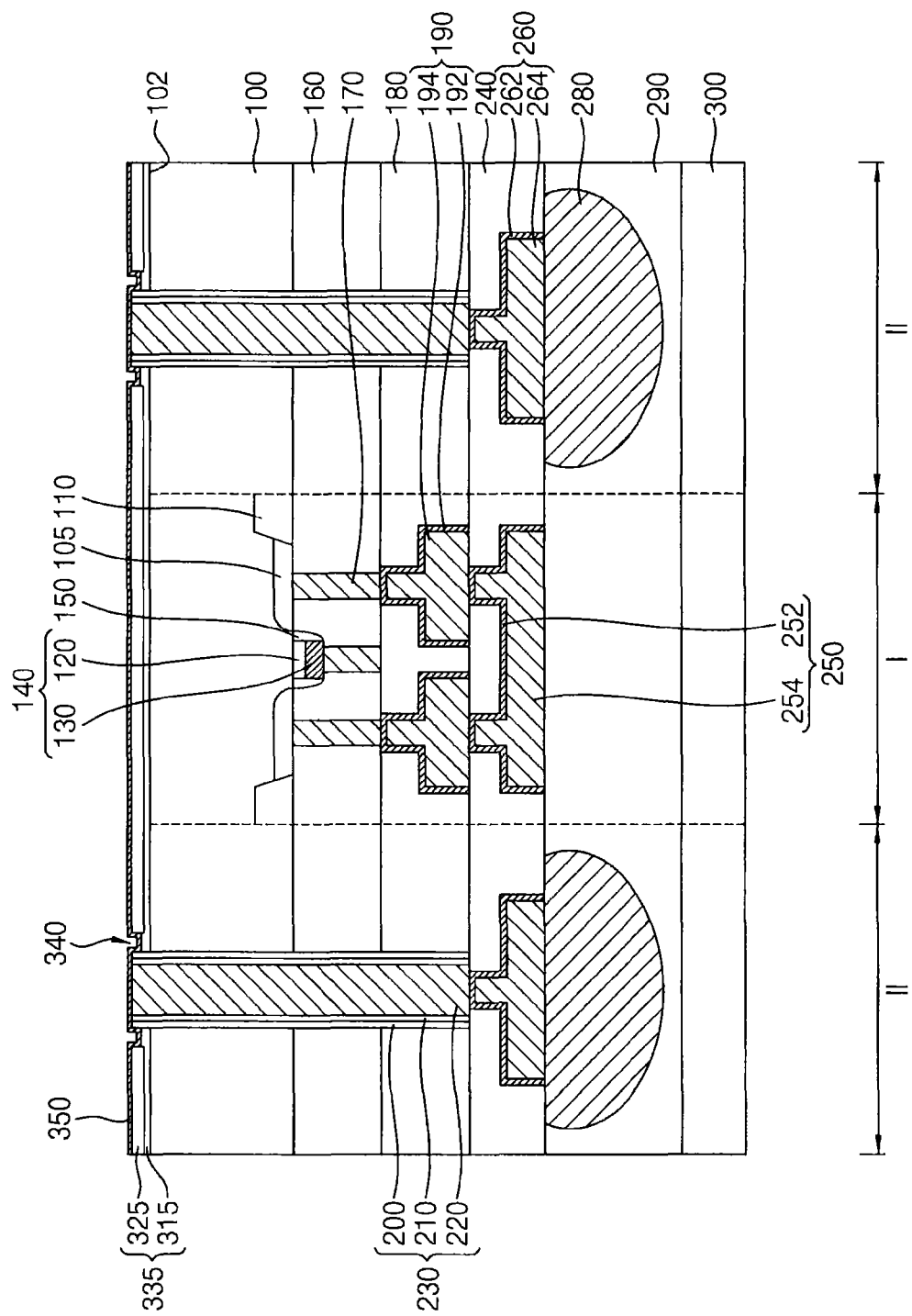

Referring to FIG. 19, a third seed layer 350 may be conformally formed on the via structure 235 and the protection layer pattern structure 335. The third seed layer 350 may completely cover the portion of the first protection layer pattern 315 exposed by the second protection layer pattern 325.

In example embodiments, the third seed layer 350 may partially or completely fill the recess 340. In FIG. 17, the third seed layer 350 may be conformally deposited to partially fill the recess 340. In this case, the third seed layer 350 may have an uneven top surface since the whole top surface of the protection layer pattern structure 335 is uneven.

For example, the third seed layer 380 may be formed to include, e.g., copper, by a physical vapor deposition (PVD) process.

In example embodiments, before forming the third seed layer 350, a diffusion barrier layer (not shown) may be formed. The diffusion barrier layer may be conformally formed on the protection layer pattern structure 335 and the via structure 235, to hinder or prevent metal elements included in the third seed layer 350 from diffusing into the protection layer pattern structure 335 and the via structure 235. For example, the diffusion barrier layer may be formed to include a metal, e.g., titanium, tantalum, etc., or a metal nitride, e.g., titanium nitride, tantalum nitride, etc.

Figure 20:
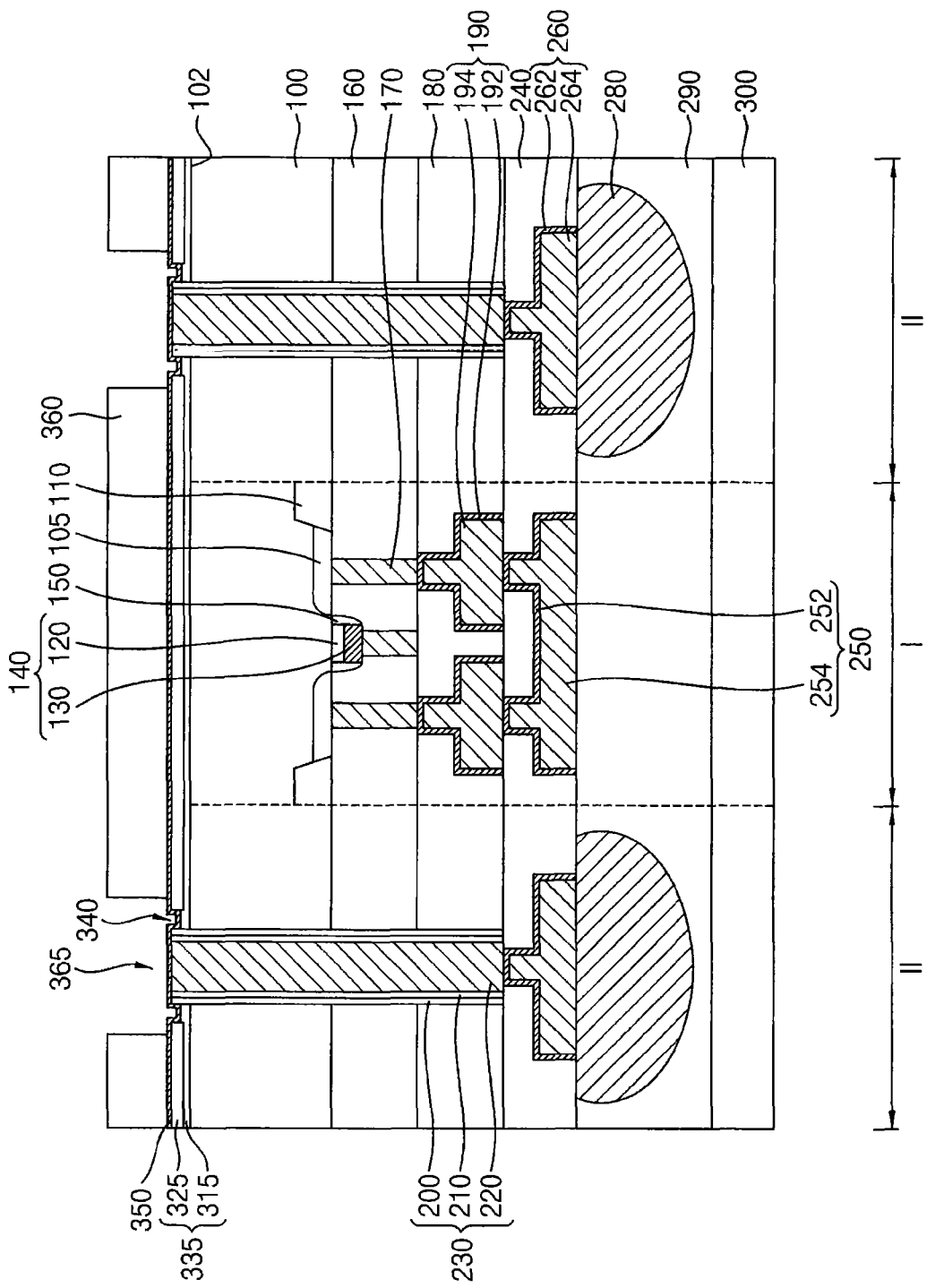

Referring to FIG. 20, a second photoresist pattern 360 may be formed on the third seed layer 350.

In example embodiments, the third photoresist pattern 360 may be formed to have an opening 365 exposing at least a portion of the third seed layer 350 on the top surface of the via structure 235. The opening 365 may expose the recess 340 formed in the top surface of the portion of the protection layer pattern structure 335 surrounding the sidewall of the via structure 235.

Figure 21:
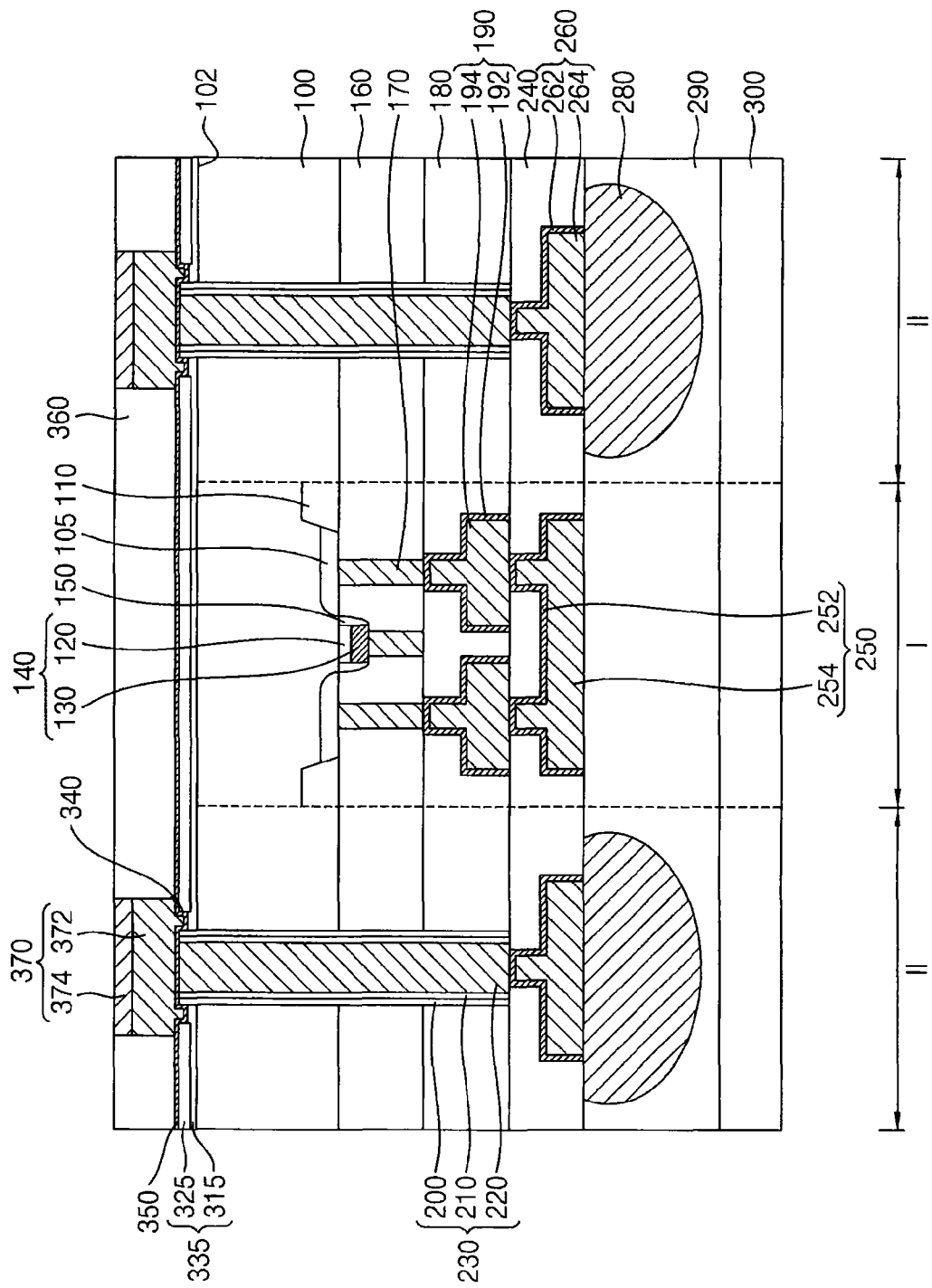

Referring to FIG. 21, a pad 370 may be formed to fill the opening 365.

In example embodiments, the pad 370 may be formed to include a lower pad 372 and an upper pad 374 sequentially stacked. For example, the lower pad 372 may be formed to include nickel, and the upper pad 374 may be formed to include gold. The lower pad 372 and the upper pad 374 may be formed by an electroplating process.

In this case, the lower pad 372 including nickel may reduce a resistance of the pad 370, and the upper pad 374 including gold may improve an adhesion strength with a second conductive bump 390 as describe later. In some embodiments, the lower pad 372 may be formed to have a width greater than a width of the upper pad 274. In other embodiments, the pad 370 may be formed to include only the lower pad 372.

As illustrated in FIG. 21, when the third seed layer 350 has an uneven top surface corresponding to the uneven top surface of the protection layer pattern structure 335, a bottom surface of the lower pad 372 may have an uneven structure. Thus, the adhesion strength between the pad 370 and the third seed layer 350 may be increased.

Figure 22:
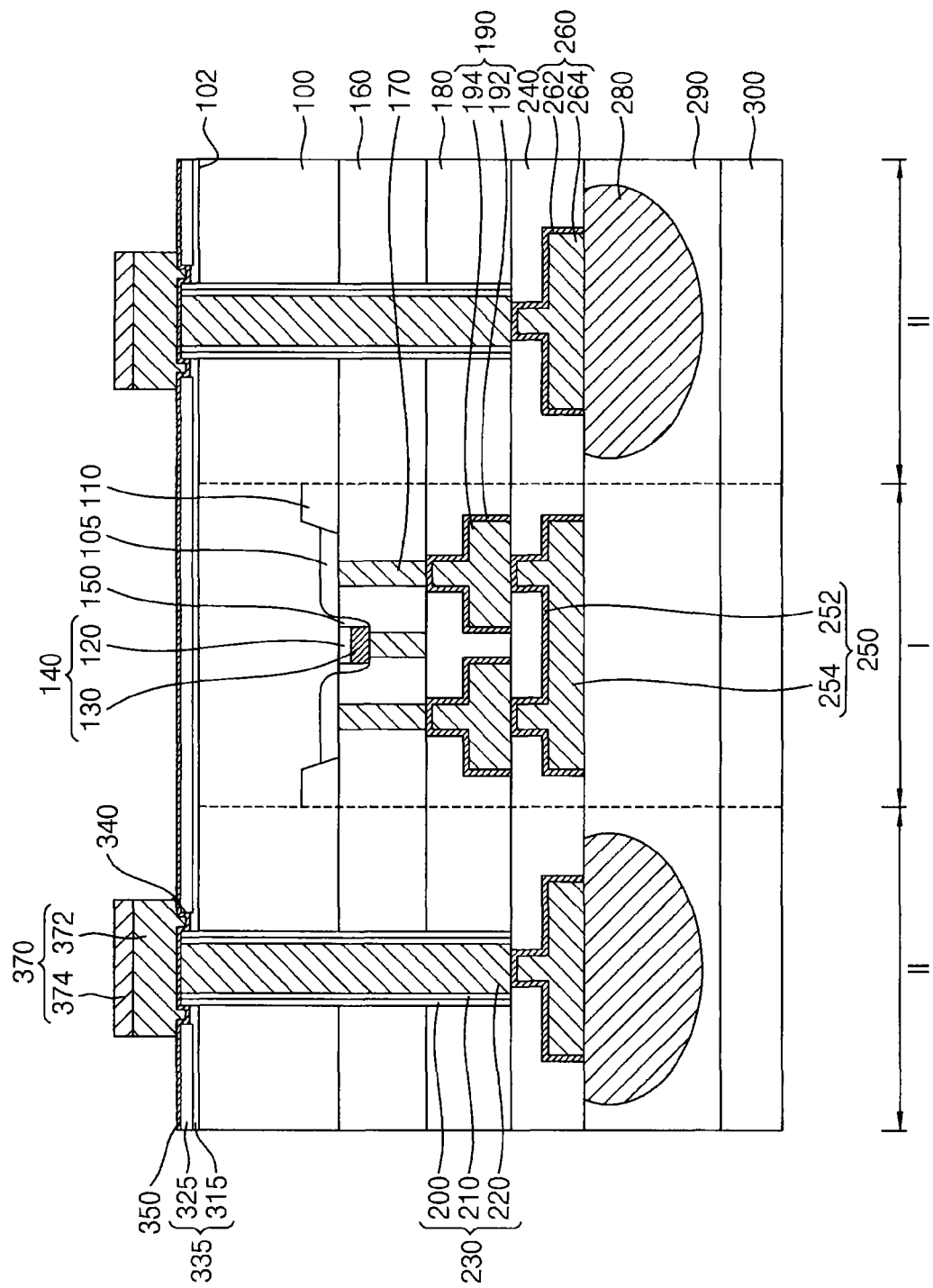

Referring to FIG. 22, the second photoresist pattern 360 may be removed.

For example, the second photoresist pattern 360 may be removed by an ashing process and/or a stripping process. Thus, a top surface of a portion of the third seed layer 350 not covered by the pad 370 may be exposed.

Referring again to FIG. 1, the portion of the third seed layer 350 not covered by the pad 370 may be removed to complete the semiconductor device.

For example, the third seed layer 350 may be partially removed by a wet etching process using an etching solution having a high etching rate for the third seed layer 350. The third seed layer 350 may be partially removed to form a seed pattern 355. Thus, the seed pattern 355 and the pad 370 sequentially stacked may form a pad structure.

In this case, the top surface of the first protection layer pattern 315 exposed by the second protection layer pattern 325, that is, the top surface of the surrounding portion 316 may be completely covered by the seed pattern 355. Accordingly, the external moisture may be hindered or prevented from permeating into the first protection layer pattern 315.

In some example embodiments, a width of the seed pattern 355 may be less than a width of the pad 370. For example, when the wet etching process is performed to form the seed pattern 355, the third seed layer 350 may be over etched inwardly from a sidewall of the pad 370, so that the seed pattern 355 may be formed to have a width less than the width of the pad 370. Even in these cases, the top surface of the first protection layer pattern 315 exposed by the second protection layer pattern 325 may be completely covered by the seed pattern 355, thereby better preventing the external moisture from permeating into the first protection layer pattern 315.

According to example embodiments, the upper portion of the first protection layer pattern 315 exposed by the second protection layer pattern 325 may be partially etched to form the recess 340, and then, the seed pattern 355 may be formed to cover the recess 340. Thus, the top surface of the exposed portion of the first protection layer pattern 315 may be blocked from the outside and the external moisture may be hindered or prevented from permeating into the first protection layer pattern 315, to thereby provide a semiconductor device having a high reliability and excellent operating performance.

Figure 23:
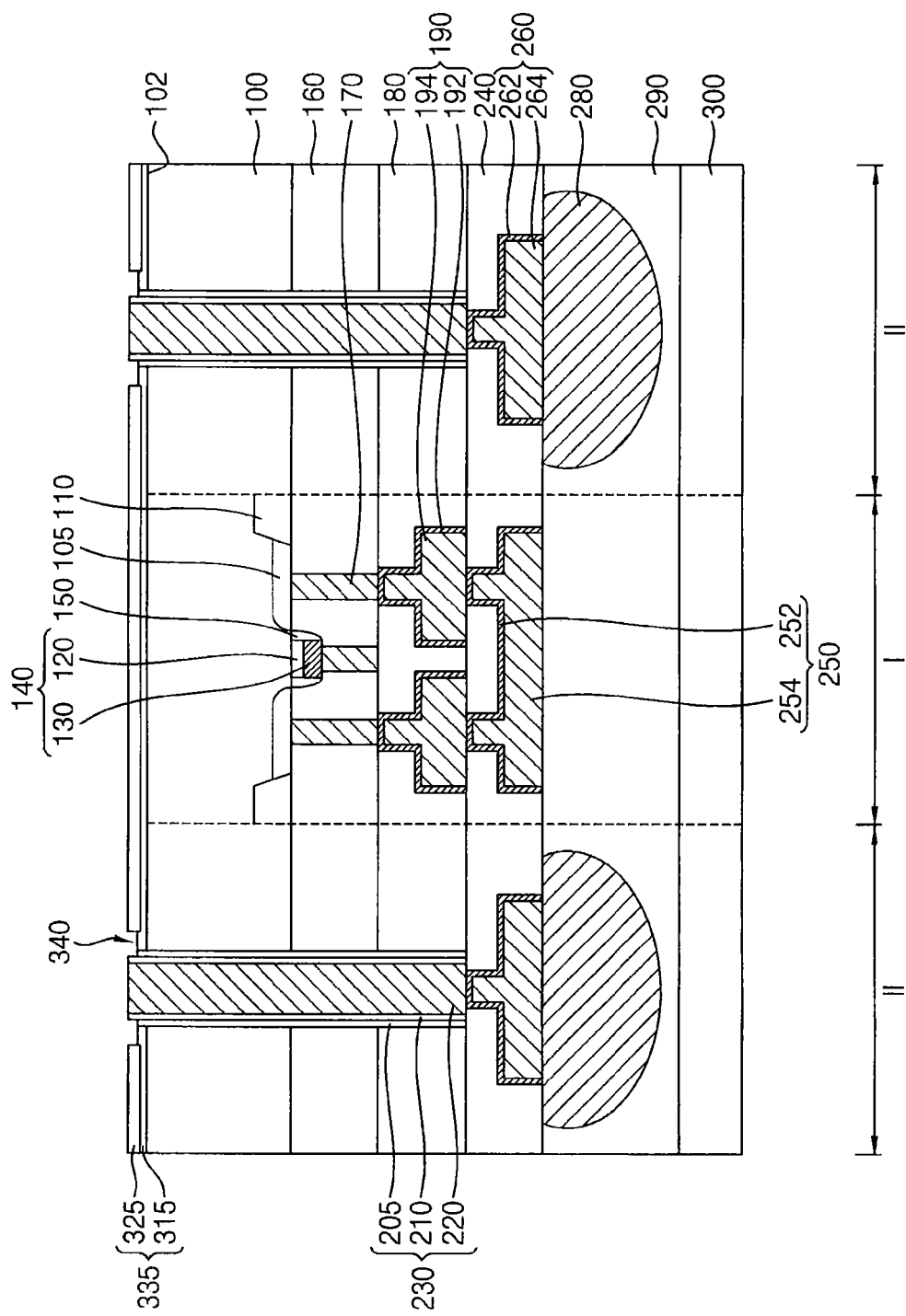

FIG. 23 is a cross-sectional view illustrating a method of manufacturing a semiconductor device in accordance with other example embodiments. The method may include processes substantially the same as or similar to the processes as described with reference to FIGS. 10 to 22, except for a process of forming the first recess. Thus, same reference numerals will be used to refer to the same or like elements and any further repetitive explanation concerning the above elements will be omitted.

First, processes substantially the same as or similar to the processes described with reference to FIGS. 10 to 17 may be performed, to form the protection layer pattern structure 335 and the via structure 235. In here, the first protection layer pattern 315 of the protection layer pattern structure 335 may include the surrounding portion surrounding the sidewall of the via structure 235, and the top surface of the surrounding portion may be exposed to outside, not covered by the second protection layer pattern 325.

Referring to FIG. 23, a portion of an exposed upper portion of the first protection layer pattern 315 may be removed to form a recess 340.

The exposed upper portion of the first protection layer pattern 315 may be partially removed by a wet etching process or a dry etching process. For example, the wet etching process may be performed using an etching solution having a high etching rate for the first protection layer pattern 315 to partially remove the exposed upper portion of the surrounding portion of the first protection layer pattern 315.

When the wet etching process is performed, a portion of the insulation layer pattern 205 may be removed together. That is, an upper portion of the insulation layer pattern 205 may be removed to expose a portion of an upper sidewall of the second barrier pattern 215. Thus, the recess 340 may be formed to expose the top surface of the surrounding portion of the first protection layer pattern 315 and the upper sidewall of the second barrier pattern 215. A bottom surface of the recess 340 may be the top surface of the surrounding portion of the first protection layer pattern 315 and the top surface of the insulation layer pattern 205.

Then, processes substantially the same as or similar to the processes described with reference to FIGS. 19 to 22 may be performed, to form the third seed layer 350 covering the top surface of the first protection layer pattern 315 and the top surface of the insulation layer pattern 205, and the pad 370 on the third seed layer 350.

Referring again to FIG. 3, a portion of the third seed layer 350 not covered by the pad 370 may be removed to complete the semiconductor device.

For example, the third seed layer 350 may be partially removed by a wet etching process using an etching solution having a high etching rate for the third seed layer 350. The third seed layer 350 may be partially removed to form a seed pattern 355. Thus, the seed pattern 355 and the pad 370 sequentially stacked may form a pad structure.

In this case, the top surface of the first protection layer pattern 315 exposed by the second protection layer pattern 325, that is, the top surface of the surrounding portion may be completely covered by the seed pattern 355. Accordingly, the external moisture may be better prevented from permeating into the first protection layer pattern 315.

In some example embodiments, a width of the seed pattern 355 may be less than a width of the pad 370. For example, when the third seed layer 350 is etched by the wet etching process to form the seed pattern 355, the third seed layer 350 may be over etched inwardly from the sidewall of the pad 370 so that the width of the seed pattern 355 may be less than the width of the pad 370. Even in these cases, the top surface of the first protection layer pattern 315 exposed by the second protection layer pattern 325 may be completely covered by the seed pattern 355, thereby reducing or preventing the external moisture from permeating into the first protection layer pattern 315.

Figure 24:
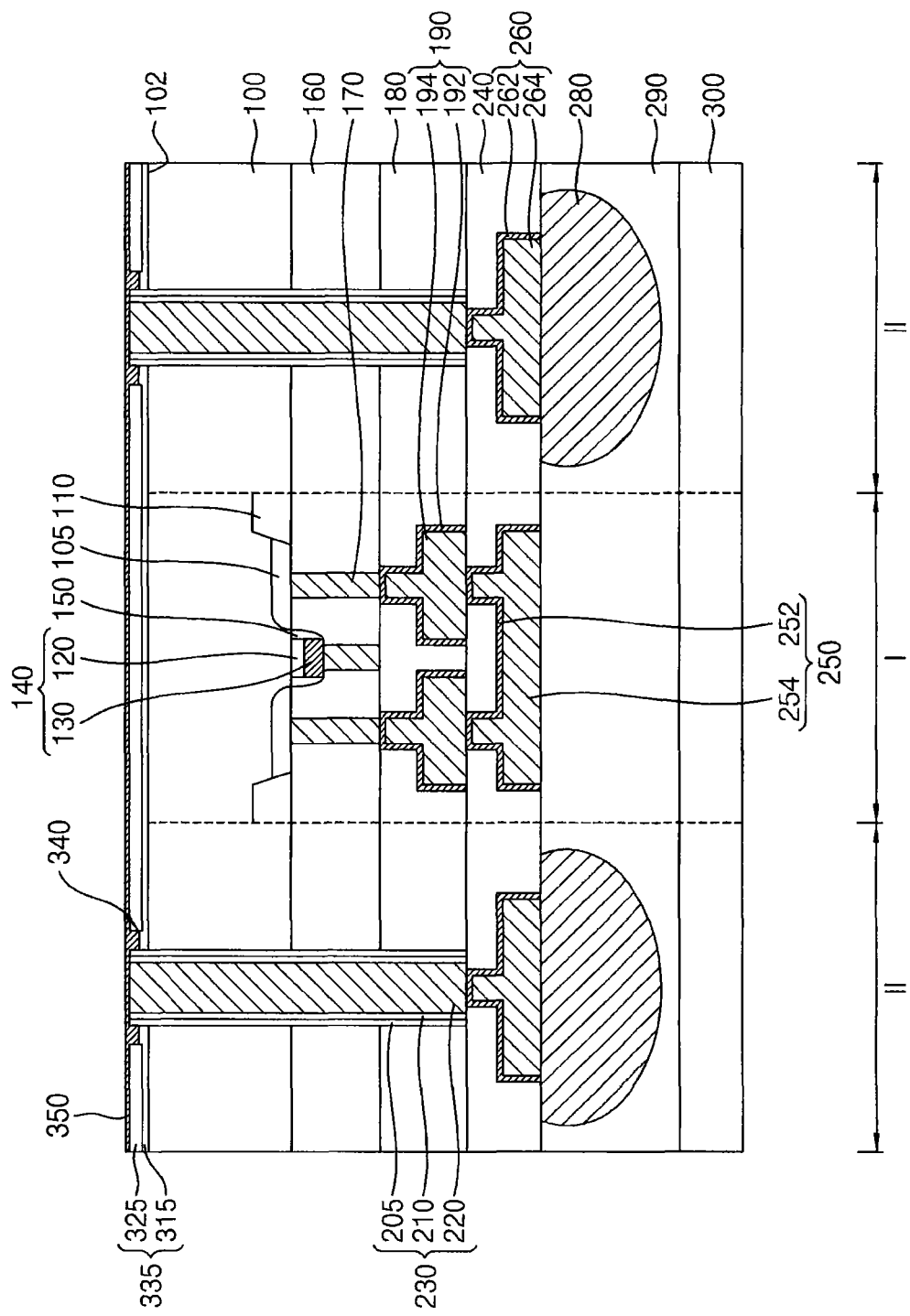

FIG. 24 is a cross-sectional view illustrating methods of manufacturing a semiconductor device in accordance with other example embodiments. The methods may include processes substantially the same as or similar to the processes as described with reference to FIGS. 10 to 22, except for a process of forming the seed pattern. Thus, same reference numerals will be used to refer to the same or like elements and any further repetitive explanation concerning the above elements will be omitted.

First, processes substantially the same as or similar to the processes described with reference to FIGS. 10 to 18 may be performed, to form the protection layer pattern structure 335 and the via structure 235.

The first protection layer pattern 315 of the protection layer pattern structure 335 may include the surrounding portion surrounding the sidewall of the via structure 235 and a protecting portion between the second protection layer pattern 325 and the substrate 100. The top surface of the surrounding portion may be exposed by the second protection layer pattern 325. Thus, a first recess 340 may be defined by a sidewall of the via structure 335, a top surface of the first protection layer pattern 315, and a sidewall of the second protection layer pattern 325.

Referring to FIG. 24, a third seed layer 350 may be formed on the protection layer pattern structure 335 and the via structure 335. The third seed layer 350 may completely cover the top surface of the first protection layer pattern 315 exposed by the second protection layer pattern 325.

The third seed layer 350 may be formed to sufficiently fill the first recess 340. Thus, a bottom surface of the third seed layer 350 may be uneven and a top surface of the third seed layer 350 may be flat.

Then, processes substantially the same as or similar to the processes described with reference to FIGS. 20 to 22 may be performed, to form the pad 370 on the third seed layer 350 which covers the top surface of the first protection layer pattern 315 and the top surface of the insulation layer pattern 205.

Referring again to FIG. 6, a portion of the third seed layer 350 not covered by the pad 370 may be removed to complete the semiconductor device.

For example, the third seed layer 350 may be partially removed by a wet etching process using an etching solution having a high etching rate for the third seed layer 350. The third seed layer 350 may be partially removed to form a seed pattern 355. Thus, the seed pattern 355 and the pad 370 sequentially stacked may form a pad structure. In this case, a width of the seed pattern may be substantially the same as a width of the pad 370.

The top surface of the first protection layer pattern 315 exposed by the second protection layer pattern 325, that is, the top surface of the surrounding portion may be completely covered by the seed pattern 355. Accordingly, the external moisture may be hindered or prevented from permeating into the first protection layer pattern 315.

In some example embodiments, the width of the seed pattern 355 may be less than the width of the pad 370. For example, when the wet etching process is performed to form the seed pattern 355, the third seed layer 350 may be over etched inwardly from a sidewall of the pad 370, so that the seed pattern 355 may be formed to have a width less than the width of the pad 370. Even in these cases, the top surface of the first protection layer pattern 315 exposed by the second protection layer pattern 325 may be completely covered by the seed pattern 355, thereby better preventing the external moisture from permeating into the first protection layer pattern 315.

Figure 25:
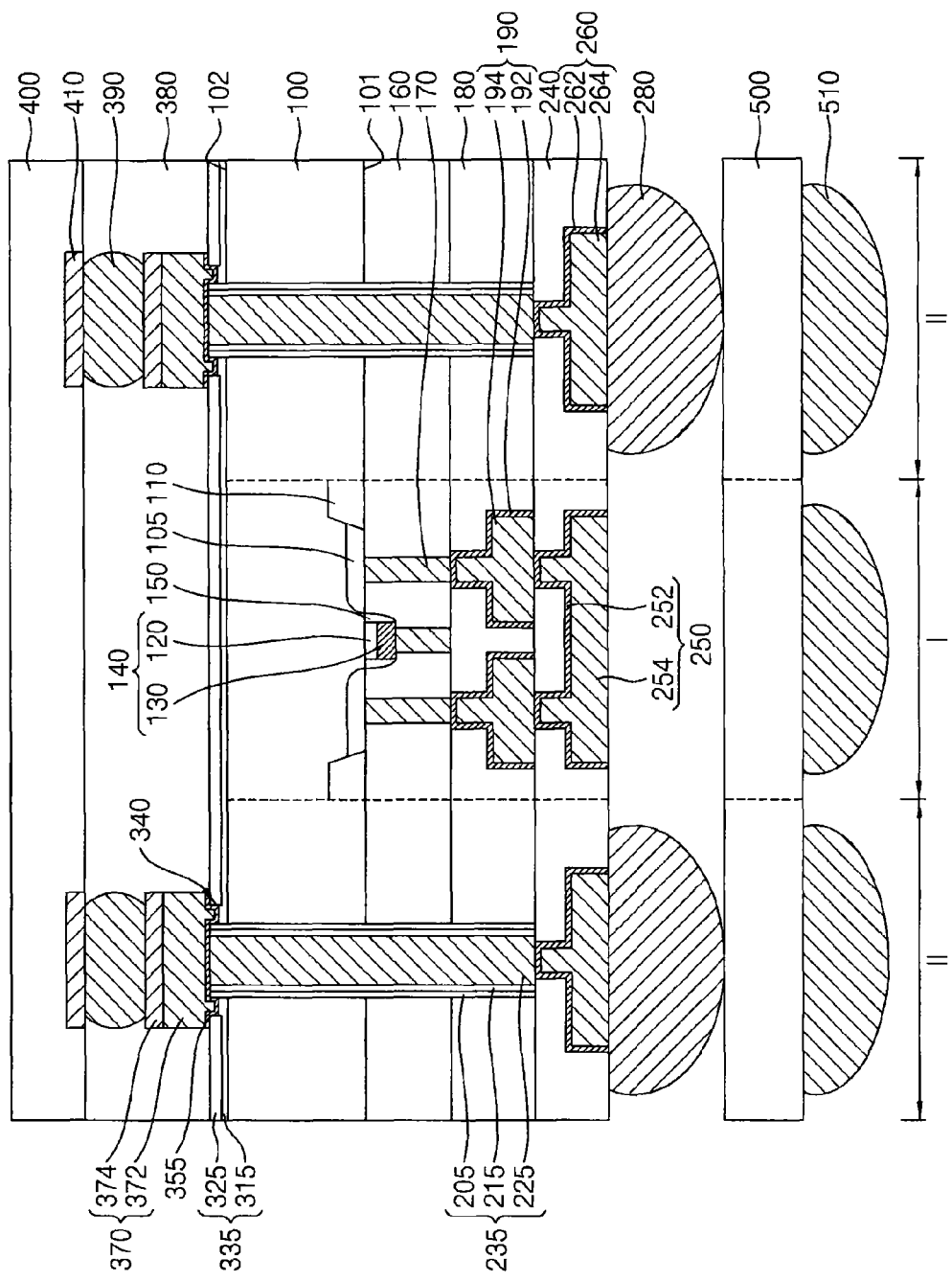

FIG. 25 is a cross-sectional view illustrating a semiconductor package in accordance with example embodiments. The semiconductor package may include semiconductor devices illustrated with reference to FIGS. 1 to 9, however, only the semiconductor package including the semiconductor device of FIG. 1 will be illustrated herein. That is, the semiconductor package of FIG. 25 may include a first semiconductor chip containing the semiconductor device of FIG. 1.

Referring to FIG. 25, the semiconductor package may include first and second semiconductor chips sequentially stacked on a package substrate 500. The semiconductor package may further include first and second conductive bumps 280 and 390, a molding member 380, and an external connection terminal 510.

The package substrate 500 may be an insulation substrate on which circuit patterns (not shown) may be printed, e.g., a printed circuit board (PCB). The external connection terminal 510 may be formed beneath the package substrate 500, and thus the semiconductor package may be mounted on a module substrate (not shown) via the external connection terminal 510.

The first semiconductor chip may be mounted on the package substrate 500 via the first conductive bump 280, and may have a structure substantially the same as or similar to that of the semiconductor device of FIG. 1.

In an example embodiment, the first semiconductor chip may be a chip having logic devices, e.g., a central processing unit (CPU), an application processor (AP), etc.

The second semiconductor chip may include an upper substrate 400 having a conductive pad 410 at a lower portion thereof, and various types of circuit elements (not shown) may be formed on the upper substrate 400. In an example embodiment, the second semiconductor chip may be a chip having a dynamic random access memory (DRAM) device, a static random access memory (SRAM) device, a flash memory device, etc.

The first and second semiconductor chips may be electrically connected to each other via a pad structure, the second conductive bump 390, and the conductive pad 410, and the molding member 380 may be formed between the first and second semiconductor chips. The molding member 380 may include, e.g., epoxy molding compound (EMC).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor device, comprising:
   a substrate;
   a via structure in the substrate, wherein a portion of the via structure extends past a surface of the substrate;

a protection layer pattern structure on the surface of the substrate, wherein the protection layer pattern includes a first protection layer pattern and a second protection layer pattern on the first protection layer pattern, the first protection layer pattern surrounding a lower sidewall of a protruding portion of the via structure from the surface of the substrate, the second protection layer pattern being spaced apart from the protruding portion of the via structure by a predetermined distance;

a pad structure on the via structure and the protection layer pattern structure, wherein the pad structure covers a portion of a top surface of the first protection layer pattern; and a seed pattern disposed between the via structure and the pad structure, between the top surface of the first protection layer pattern and the pad structure, or between the second protection layer pattern and the pad structure, wherein the pad structure laterally overlaps the first and second protection layer patterns by a first distance and the seed pattern laterally overlaps the first and second protection layer patterns by a second distance that is less than the first distance, and wherein the via structure comprises:

a via hole in the substrate;

a via electrode in the via hole, the via electrode including a conductive pattern and a barrier pattern on a sidewall of the conductive pattern; and an insulation layer pattern in the via hole surrounding the via electrode, wherein the insulation layer pattern is between the via electrode and the substrate.

2. The semiconductor device of claim 1, wherein a top surface of the insulation layer pattern is lower than a top surface of the via electrode.

3. The semiconductor device of claim 1, wherein the conductive pattern comprises a metal, the barrier pattern comprises a metal nitride and the insulation layer pattern comprises silicon nitride.

4. The semiconductor device of claim 1, wherein the first protection layer pattern has an etch selectivity that is different from an etch selectivity of the second protection layer pattern.

5. The semiconductor device of claim 1, wherein the first protection layer pattern comprises silicon oxide and the second protection layer pattern comprises silicon nitride.

6. The semiconductor device of claim 1, wherein the top surface of the portion of the first protection layer pattern that is exposed by the second protection layer pattern is lower than a top surface of the via structure.

7. The semiconductor device of claim 6, wherein the top surface of the portion of the first protection layer pattern that is exposed by the second protection layer pattern is higher than a bottom surface of the second protection layer pattern.

8. The semiconductor device of claim 1, wherein a bottom surface of the seed pattern has an uneven structure corresponding to height variations of the via structure and the protection layer pattern structure.

9. The semiconductor device of claim 1, wherein the seed pattern has a flat upper surface.

10. The semiconductor device of claim 1, wherein a width of the seed pattern is less than a width of the pad structure.

11. The semiconductor device of claim 1, wherein the pad structure comprises copper.

12. The semiconductor device of claim 1, wherein the pad structure comprises a lower pad on the seed pattern and an upper pad on the lower pad opposite the seed pattern.

13. The semiconductor device of claim 12, wherein the lower pad comprises nickel, and the upper pad comprises gold.

14. A semiconductor device, comprising:

a substrate;

a conductive plug in the substrate, wherein a protruding portion of the conductive plug protrudes from a surface of the substrate;

a first protection layer pattern on the surface of the substrate, wherein the first protection layer pattern contacts a lower sidewall of the protruding portion of the conductive plug that extends past the surface of the substrate;

a second protection layer pattern on the first protection layer pattern opposite the substrate, wherein a sidewall of the second protection layer pattern is spaced apart from the conductive plug, and wherein the first protection layer pattern and the second protection layer pattern define a recess adjacent an upper portion of an exposed sidewall of the conductive plug;

a pad structure on the conductive plug, the first protection layer pattern and the second protection layer pattern, wherein the pad structure extends into the recess; and a seed layer between the conductive plug and the pad structure, between the first protection layer pattern and the pad structure, or between the second protection layer pattern and the pad structure, wherein the pad structure laterally overlaps the first and second protection layer patterns by a first distance and the seed layer laterally overlaps the first and second protection layer patterns by a second distance that is less than the first distance.

15. The semiconductor device of claim 14, wherein the first protection layer pattern comprises a first portion adjacent the conductive plug and a second portion that is spaced apart laterally from the conductive plug by the first portion of the first protection layer pattern, wherein the first portion of the first protection layer pattern is thicker than the second portion of the first protection layer pattern.

16. A semiconductor device, comprising:

a substrate;

a conductive plug in the substrate, wherein a portion of the conductive plug protrudes from a surface of the substrate;

a first protection layer pattern on the surface of the substrate, wherein the first protection layer pattern contacts a lower portion of an exposed sidewall of the conductive plug that extends past the surface of the substrate;

a second protection layer pattern on the first protection layer pattern opposite the substrate, wherein a sidewall of the second protection layer pattern is spaced apart from the conductive plug and exposes an upper portion of the exposed sidewall of the conductive plug, and wherein the first protection layer and the second protection layer define a recess;

a pad structure on the conductive plug, the first protection layer pattern and the second protection layer pattern, wherein the pad structure extends into the recess;

an insulation layer pattern adjacent the conductive plug, wherein the insulation layer pattern extends above the substrate by a first distance and the conductive plug extends above the substrate by a second distance that is greater than the first distance; and a seed layer disposed between the conductive plug and the pad structure between the first protection layer pattern and the pad structure, or between the second protection layer pattern and the pad structure, wherein the pad structure laterally overlaps the first and second protection layer patterns by a third distance and the seed layer laterally overlaps the first and second protection layer patterns by a fourth distance that is less than the third distance.

\* \* \* \* \*